US007358300B2

(12) United States Patent
Sakurai et al.

(10) Patent No.: US 7,358,300 B2
(45) Date of Patent: *Apr. 15, 2008

(54) COMPOSITION FOR FORMING SILICA BASED COATING FILM, SILICA BASED COATING FILM AND METHOD FOR PREPARATION THEREOF, AND ELECTRONIC PARTS

(75) Inventors: Haruaki Sakurai, Hitachi (JP); Koichi Abe, Hitachi (JP); Kazuhiro Enomoto, Hitachi (JP); Shigeru Nobe, Hitachi (JP)

(73) Assignee: Hitachi Chemical Co., Ltd., Tokyo (JP)

(*) Notice: Subject to any disclaimer, the term of this patent is extended or adjusted under 35 U.S.C. 154(b) by 219 days.

This patent is subject to a terminal disclaimer.

(21) Appl. No.: 10/926,321

(22) Filed: Aug. 26, 2004

(65) Prior Publication Data
US 2005/0119394 A1    Jun. 2, 2005

Related U.S. Application Data

(63) Continuation-in-part of application No. PCT/JP03/02157, filed on Feb. 26, 2003.

(30) Foreign Application Priority Data

| Feb. 27, 2002 | (JP) | ............................. P2002-052025 |
| Mar. 6, 2002 | (JP) | ............................. P2002-060615 |
| Mar. 6, 2002 | (JP) | ............................. P2002-060620 |
| Mar. 6, 2002 | (JP) | ............................. P2002-060622 |
| Apr. 26, 2002 | (JP) | ............................. P2002-127012 |

(51) Int. Cl.
*C08K 5/17* (2006.01)

(52) U.S. Cl. ..................... 524/588; 524/236; 524/429; 428/447; 525/100; 525/102

(58) Field of Classification Search ................ 524/588, 524/236, 429; 525/100, 102; 428/447
See application file for complete search history.

(56) References Cited

U.S. PATENT DOCUMENTS

| 4,315,091 A | * | 2/1982 | Steinberger et al. ........... 528/28 |
| 5,820,923 A | | 10/1998 | Ballance et al. |
| 6,159,546 A | | 12/2000 | Yamamoto et al. |
| 6,407,006 B1 | * | 6/2002 | Levert et al. ................ 438/761 |
| 6,503,633 B2 | * | 1/2003 | Nishikawa et al. ......... 428/447 |
| 6,576,393 B1 | * | 6/2003 | Sugita et al. ............. 430/270.1 |
| 6,586,104 B2 | * | 7/2003 | Matsuda et al. ............ 428/447 |
| 6,967,222 B2 | * | 11/2005 | Khanarian et al. ............ 521/77 |
| 2002/0186950 A1 | * | 12/2002 | Mule' et al. ................ 385/132 |
| 2003/0157248 A1 | * | 8/2003 | Watkins et al. ............. 427/256 |
| 2004/0087184 A1 | | 5/2004 | Mandal et al. |
| 2004/0253462 A1 | | 12/2004 | Narita et al. |
| 2005/0123735 A1 | * | 6/2005 | Lu et al. .................. 428/304.4 |
| 2006/0199021 A1 | | 9/2006 | Narita et al. |

FOREIGN PATENT DOCUMENTS

| EP | 1 045 290 | * 10/2000 |
| JP | 9-50994 | 2/1997 |
| JP | 11-310411 | 11/1999 |
| JP | 11-322992 | 11/1999 |
| JP | 2000-49155 A | 2/2000 |
| JP | 2000-290590 A | 10/2000 |
| JP | 2000-299316 A | 10/2000 |
| JP | 2001-002994 A | 1/2001 |
| JP | 2001-055554 A | 2/2001 |
| JP | 2001-351911 | 12/2001 |
| JP | 2002-20689 A | 1/2002 |
| JP | 2002-26003 | 1/2002 |
| JP | 2002-129103 A | 5/2002 |
| JP | 2002-293529 | 10/2002 |
| JP | 2003-064306 A | 3/2003 |
| JP | 2003-064307 A | 3/2003 |
| JP | 2003-171616 A | 6/2003 |
| WO | WO 01/19922 A1 | 3/2001 |
| WO | WO 2004/027850 A1 | 4/2004 |

OTHER PUBLICATIONS

English language translation JP 2001-55554 (Feb. 27, 2001).*
Japanese Office Action dated Sep. 25, 2007 (mailing date), issued in corresponding Japanese Patent Application No. 2003-571361.
Korean Office Action dated Apr. 10, 2006, issued in corresponding Korean Patent Application No. 10-2005-7015194.

(Continued)

*Primary Examiner*—Margaret G. Moore
(74) *Attorney, Agent, or Firm*—Westerman, Hattori, Daniels & Adrian, LLP.

(57) ABSTRACT

The composition for forming silica based coating of the invention comprises siloxane resin such as an alkoxysilane as component (a), a solvent such as an alcohol capable of dissolving the siloxane resin as component (b), an ammonium salt, etc. as component (c) and a thermal decomposing/volatile compound as component (d), wherein the stress of the coating obtained by heat treatment at 150° C./3 min is 10 MPa and the specific permittivity of the silica based coating obtained by final curing is less than 3.0. The composition for forming silica based coating according to the invention can form a silica based coating having low permittivity, excellent adhesion and sufficient mechanical strength.

13 Claims, 1 Drawing Sheet

OTHER PUBLICATIONS

Korean Office Action dated Sep. 13, 2007, issued in corresponding Korean Patent Application No. 10-2005-7015194.

Korean Office Action dated Nov. 29, 2006, issued in corresponding Korean Patent Application No. 10-2005-7015194.

Korean Office Action dated Apr. 13, 2007, issued in corresponding Korean Patent Application No. 10-2005-7015194.

Chinese Office Action dated Mar. 23, 2007, issued in corresponding Chinese Patent Application No. 2005101170956.

Taiwanese Office Action dated Nov. 28, 2007, issued in corresponding Taiwanese Patent Application No. 09104285.

* cited by examiner

COMPOSITION FOR FORMING SILICA BASED COATING FILM, SILICA BASED COATING FILM AND METHOD FOR PREPARATION THEREOF, AND ELECTRONIC PARTS

CROSS REFERENCE TO RELATED APPLICATIONS

This application is a continuation-in-part of co-pending patent application PCT/JP03/02157, which was filed on Feb. 26, 2003.

BACKGROUND OF THE INVENTION

1. Field of the Invention

The present invention relates to a composition for forming a silica based coating film, to a silica based coating film and a method for preparation thereof, and to electronic Parts.

2. Related Background Art

With progressive miniaturization of wiring by high integration in electronic device parts, including semiconductor elements such as LSIs, the increased signal delay time due to decreasing interconnect pitch has become a significant problem, and a demand therefore exists for greater heat resistance and mechanical properties, as well as low specific permittivity and shorter heat treatment steps for insulating materials of electronic parts.

Generally speaking, the signal propagation velocity (v) of wiring and the specific permittivity ($\epsilon$) of an insulating material in contact with the wiring material are in the relationship represented by the following formula (3) (where k is a constant).

$$v = k/\sqrt{\epsilon} \qquad (3)$$

In other words, high-speed signal propagation is achieved by increasing the frequency range used while also reducing the specific permittivity ($\epsilon$) of the insulating material. For example, $SiO_2$ films formed by CVD processes, having specific permittivities of about 4.2, have conventionally been used as materials for forming interlaminar insulating films, but from the standpoint of reducing device interconnect pitch and increasing LSI operation speed, materials exhibiting even lower permittivities have been desired.

Yet, the currently realized low permittivity materials include SiOF films with specific permittivities of about 3.5, formed by CVD. Other examples are organic SOG (Spin On Glass) and organic polymers used as insulating materials with specific permittivities of 2.5-3.0. Porous materials having gaps in the films are also promising as insulating materials with specific permittivities of 2.5 or lower, and a great deal of research and development has been conducted toward their application as LSI interlaminar insulating films.

As a method for forming such porous materials there has been proposed a method for creating low permittivities in organic SOG materials, as disclosed in Japanese Unexamined Patent Publication HEI No. 11-322992 and Japanese Unexamined Patent Publication HEI No. 11-310411. This method involves first forming a coating film using a composition comprising a polymer whose properties are such that it volatilizes or decomposes upon heating with hydrolytic polycondensation of a metal alkoxysilane, and then heating the coating film to form pores therein.

SUMMARY OF THE INVENTION

However, when the present inventors examined the conventional method in detail, it was found that during condensation of the organic SOG in the final heating step of the conventional method, sudden stress acts on the coating film in addition to the heat-induced stress and in some cases can have a major effect impairing the function as lower layer wiring.

Furthermore, in the conventional method, the heating temperature during the final curing step of the coating film is as high as 450° C. or above, while a period of time of as long as 1 hour can be required for curing. This excessively increases the amount of heat input (thermal budget) and can lead to deterioration of the lower layers, particularly the wiring layer. The increased heat input can also result in notable warping of the board.

Moreover, as mentioned above, miniaturization of wiring by high integration is accelerating, leading to advancements in thinning and multilayering of component layers of devices, and in new materials for wiring layers and the like. The consequent effect of material deterioration of layers due to heat input is expected to become even more significant in the future, and thus it is essential to improve the heat history through reduction in heat load during the various processes.

The present inventors have discovered, in addition, that using the aforementioned conventional method requires introduction of numerous pores (gaps) in the film in order to achieve the targeted low permittivity required for an insulating film. In cases where the mechanical film strength or film hardness of the SOG used as the base material for the film is insufficient by itself, excessively increasing the porosity tends to further reduce the mechanical strength of the film. Stated differently, the conventional method has had a major problem in terms of process adaptability, in that reducing the permittivity of the insulating film tends to result in reduced film strength.

When a silica based coating film is applied as an interlaminar insulating film in a Cu-damascene process it is common to use an $SiO_2$ film or the like formed by CVD as a cap film, but weak adhesion (bonding) at their interface can result in interfacial delamination during the Cu-CMP (Chemical Mechanical Polish) step in which the excess Cu film produced upon lamination of the wiring metal is polished.

In addition, increased permittivity due to moisture absorption, or increased desorption of gas, can occur depending on the components added to the interlaminar insulating film material. Such conditions are highly inconvenient from the standpoint of process adaptability.

The present invention has been accomplished in light of these circumstances, and its object is to provide a composition for forming silica based coating film which can yield a silica based coating film with excellent low permittivity and adequate mechanical strength, while allowing adequate hardening at low temperature or in a short period of time for formation of the silica based coating film, minimizing sudden increase in stress of the film, and achieving increased adhesion with other layers (films) and improved electrical reliability, as well as a silica based coating film obtained using the composition, a method for preparation thereof, and electronic parts comprising the silica based coating film.

In order to solve the problems described above, the present inventors focused on the curing behavior exhibited during formation of silica based coating films from liquid compositions, and completed the present invention after much diligent research on the composition materials and their proportions.

Specifically, the composition for formation of a silica based coating film according to the invention comprises siloxane resin, is fluid and forms a silica based coating film by curing upon application of heat when the film is coated onto a substrate, and particularly is characterized by having curing properties such that the stress of the silica based coating film upon precuring by heating at 150° C. for 3 minutes is 10 MPa or greater, and the specific permittivity of the silica based coating film obtained by the final curing is less than 3.0. Here, "stress" is the value determined by the following method.

[Stress Evaluation Method]

(1) Formation of a Silica Based Coating Film for Stress Measurement

First, the composition for forming silica based coating film is coated onto a prescribed Si wafer to a specified thickness to form a coating. More specifically, a 5-inch outer diameter Si wafer (thickness: 625±25 μm) based on orientation flat is placed at a prescribed position in a thin-film stress measuring apparatus (KLA Tencor apparatus, Model FLX-2320), and the degree of "warping" (initial value) of the Si wafer is measured in an atmosphere with an ambient temperature of 23° C.±2° C. and a humidity of 40%±10%.

Next, the Si wafer is removed from the apparatus and the composition for formation of the silica based coating film is coated thereon by a spin coating method to form a coating. The Si wafer is then heat treated under 150° C./3 min hotplate conditions, for removal of the solvent in the composition to accomplish precuring, in order to form a silica based coating film. After completion of heating, the thickness of the silica based coating film is measured. The Si wafer based on orientation flat as before coating formation is placed at a prescribed position in the apparatus (FLX-2320), and the degree of "warping" of the Si wafer is measured.

The initial and post-heat treatment warping values for the obtained Si wafer, and the silica based coating film thickness, are used to calculate the silica based coating film stress from the relationship represented by the following formula (4):

$$\sigma = \left\{ \frac{E \cdot b^2 \cdot \delta}{3 \cdot (1-v) \cdot l^2 \cdot d} \right\} \times 10^{-7}$$

In this formula, σ represents the silica based coating film stress (MPa), E represents the Young's modulus (dyn/cm$^2$) of the Si wafer, b represents the thickness (μm) of the Si wafer, v represents the Poison ratio (–) of the Si wafer, l represents the scanning distance (mm) of the surface roughness total when determining the "warping", d represents the thickness (μm) of the silica based coating film, and δ represents the displacement of "warping" (i.e. the absolute value of the difference between the initial and post-heat treatment values for "warping") (μm) of the Si wafer.

The silica based coating film formation and stress evaluation are carried out for five Si wafers, and the average value for the silica based coating film stress is determined for heat treatment at 150° C./3 min. The term "stress" as used according to the present invention refers to this absolute value.

The composition for forming a silica based coating film according to the invention is coated onto a substrate such as a wafer, and then heated for curing to form a silica based coating film exhibiting a low permittivity (Low-k film). Since the composition has a stress of 10 MPa or greater when precured at 150° C. for 3 minutes, bonds forming the siloxane skeleton tend to arise to some degree even with such low temperature heat treatment. Consequently, curing of the silica based coating film can be achieved by heat treatment at a lower temperature and with a shorter time than according to the prior art. If the stress is less than 10 MPa, formation of the siloxane skeleton is insufficient with low temperature heat treatment, and it becomes difficult to significantly lower the treatment temperature for precuring.

Specifically, the composition for forming a silica based coating film preferably comprises component (a): siloxane resin obtained by hydrolytic condensation of a compound represented by the following formula (1):

$$R^1_n SiX_{4-n} \quad (1)$$

(wherein R$^1$ represents an H atom or F atom, a group containing a B atom, N atom, Al atom, P atom, Si atom, Ge atom or Ti atom, or a C$_{1-20}$ organic group, X represents a hydrolyzable group, and n represents an integer of 0-2, with the proviso that when n is 2, each R$^1$ may be the same or different, and when n is 0-2, each X may be the same or different), component (b): a solvent capable of dissolving component (a), component (c): an onium salt, and component (d): a thermal decomposing/volatile compound which undergoes thermal decomposition or volatilization at a heating temperature of 250-500° C.

When curing proceeds by heating of this type of composition, the thermal decomposition or volatilization of component (d) results in gradual formation of fine pores in the film to allow uniformity of porosity and shape during the final curing. In addition, the presence of the onium salt as component (c) promotes the dehydrating condensation reaction of the compound represented by (1), reducing the number of Si—OH bonds to increase the density of siloxane bonds. In addition, the process of pore formation, the high densification of siloxane bonds and the annealing effect during the final heating act in combination to cause a relaxation of stress in the film. However, the effect is not limited to that described above.

In most cases, a silica based coating film obtained by curing under such heat treatment tends to undergo increased stress, as mentioned above, which can be disadvantageous in terms of the device properties, but since the composition of the invention permits relaxation of stress of the silica based coating film due to the curing history of heat application, the effect of the stress is reduced.

Component (a) comprises at least one species of atom selected from the group consisting of H, F, B, N, Al, P, Si, Ge, Ti and C atoms at preferably no more than 0.65 mole, more preferably no more than 0.55 mole, even more preferably no more than 0.50 mole and most preferably no more than 0.45 mole as the total proportion with respect to 1 mole of Si atoms. The lower limit for the total proportion is preferably about 0.20. This will prevent reduction in the adhesion for other films (layers) and the mechanical strength of the silica based coating film.

Alternatively, the composition for forming a silica based coating film according to the invention comprises siloxane resin, is fluid and forms a silica based coating film by curing upon application of heat when the film is coated onto a substrate, and is characterized by having a curing property such that when the film is subjected to precuring at a first heating temperature and then subjected to final curing at a second heating temperature higher than the first heating temperature, the second stress of the silica based coating film resulting from the final curing at the second heating temperature is less than the first stress of the silica based coating film resulting from the precuring at the first heating temperature.

Specifically, such a curing property can be suitably achieved if the first heating temperature $T_1$ is in the range of preferably at least 100° C. and below 350° C., more preferably 150-300° C. and most preferably 150-250° C., while the second heating temperature $T_2$ is in the range of preferably 350-500° C. Here, the "stress" of the "first stress" and "second stress" refers to the value determined by the method explained below.

[Stress Evaluation Method]

(1) Formation of a Silica Based Coating Film for Stress Measurement

First, the composition for forming the silica based coating film is coated onto a prescribed Si wafer to a specified thickness to form a coating. More specifically, a 5-inch outer diameter Si wafer (thickness: 625±25 μm) based on orientation flat is placed at a prescribed position in a thin-film stress measuring apparatus (KLA Tencor apparatus, Model FLX-2320), and the degree of "warping" (initial value) of the Si wafer is measured in an atmosphere with an ambient temperature of 23° C.±2° C. and a humidity of 40%±10%.

Next, the Si wafer is removed from the apparatus and the composition for forming the silica based coating film is coated thereon by a spin coating method to form a coating. The Si wafer is then heat treated under hotplate conditions with a prescribed first heating temperature $T_1°$ C. (for example, 150° C./1 min+250° C./1 min), for removal of the solvent in the composition to accomplish precuring, in order to form a silica based coating film (precuring step). After completion of heating, the thickness of the silica based coating film is measured. The Si wafer based on orientation flat as before coating formation is placed at a prescribed position in the apparatus (FLX-2320), and the degree of "warping" of the Si wafer is measured.

Thereafter, the Si wafer which has completed the precuring step is subjected to final curing by heat treatment at a second heating temperature $T_2°$ C. (for example, 400° C./30 min) in a nitrogen ($N_2$) gas atmosphere (final curing step). The thickness of the obtained silica based coating film is measured, and the degree of "warping" of the Si wafer is measured in the same manner as for the previously mentioned Si wafer.

The initial value for warping of the Si wafer, the value for warping of both Si wafers after heat treatment and the film thickness of the silica based coating film on both Si wafers were used to calculate the stress from the relationship represented by the aforementioned formula (4):

$$\sigma = \left\{ \frac{E \cdot b^2 \cdot \delta}{3 \cdot (1-v) \cdot l^2 \cdot d} \right\} \times 10^{-7}$$

In this formula, σ represents the silica based coating film stress (MPa), E represents the Young's modulus (dyn/cm²) of the Si wafer, b represents the thickness (μm) of the Si wafer, v represents the Poison ratio (−) of the Si wafer, l represents the scanning distance (mm) of the surface roughness total when determining the "warping", d represents the thickness (μm) of the silica based coating film, and δ represents the displacement of "warping" (i.e. the absolute value of the difference between the initial and post-heat treatment values for "warping") (μm) of the Si wafer.

The silica based coating film formation and stress evaluation are carried out for five Si wafers, and the average value for the silica based coating film stress is determined for each heating temperature. The stress value calculated for the silica based coating film on the Si wafer subjected to precuring treatment at the first heating temperature $T_1°$ C. is the "first stress", and the stress value calculated for the silica based coating film on the Si wafer subjected to final curing treatment at the second heating temperature $T_2°$ C. is the "second stress". The term "stress" as used according to the present invention refers to the absolute value.

This composition for forming a silica based coating film is coated onto a substrate such as a wafer, and then heated for curing to form a silica based coating film exhibiting a low permittivity (Low-k film). In the heat treatment step at the first heating temperature, the composition gradually hardens from the initial heating to the later heating, with a concomitant increase in stress. Then, the heat treatment at the second heating temperature, i.e. the final curing treatment, causes the resulting silica based coating film stress to be reduced from the first stress to the second stress.

In most cases, a silica based coating film obtained by curing under such heat treatment tends to undergo increased stress, as mentioned above, which can be disadvantageous in terms of the device properties, but since the composition of the invention permits relaxation of stress of the silica based coating film due the curing history of heat application, the effect of the stress is reduced.

Specifically, this composition for forming a silica based coating film preferably comprises component (a): siloxane resin obtained by hydrolytic condensation of a compound represented by the following formula (1):

$$R^1{}_n SiX_{4-n} \qquad (1)$$

(wherein $R^1$ represents an H atom or F atom, a group containing a B atom, N atom, Al atom, P atom, Si atom, Ge atom or Ti atom, or a C1-20 organic group, X represents a hydrolyzable group, and n represents an integer of 0-2, with the proviso that when n is 2, each $R^1$ may be the same or different, and when n is 0-2, each X may be the same or different), component (b): a solvent capable of dissolving component (a), component (c): an onium salt, and component (d): a thermal decomposing/volatile compound which undergoes thermal decomposition or volatilization at a heating temperature of 250-500° C.

When curing proceeds by heating of this type of composition, the thermal decomposition or volatilization of component (d) results in gradual formation of fine pores in the film to allow uniformity of porosity and shape during the final curing.

In addition, the presence of the onium salt as component (c) promotes the dehydrating condensation reaction of the compound represented by (1), reducing the number of Si—OH bonds to increase the density of siloxane bonds. In addition, the process of pore formation, the high densification of siloxane bonds and the annealing effect during the final heating act in combination to cause a relaxation of stress in the film. However, the effect is not limited to that described above.

Component (a) comprises at least one species of atom selected from the group consisting of H, F, B, N, Al, P, Si, Ge, Ti and C atoms at preferably no more than 0.65 mole, more preferably no more than 0.55 mole, even more preferably no more than 0.50 mole and most preferably no more than 0.45 mole as the total proportion with respect to 1 mole of Si atoms. The lower limit for the total proportion is preferably about 0.20. This will prevent reduction in the adhesion for other films (layers) and the mechanical strength of the silica based coating film.

Also, the composition for forming a silica based coating film according to the invention comprises siloxane resin, is fluid and forms a silica based coating film by curing upon application of heat when the film is coated onto a substrate, and is characterized by have a curing property such that the value of parameter $K_1$ as determined by a Modified-Edge Lift-OFF TEST (m-ELT) is 0.20 or greater, preferably 0.25 or greater, more preferably 0.27 or greater and most preferably 0.29 or greater, and the specific permittivity of the silica based coating film obtained by the final curing is less than 3.0.

The upper limit for $K_1$ is preferably about 0.6. Here, the "m-ELT" is the test method described below, wherein $K_1$ is the physical parameter obtained as a result of the test.

[Modified-Edge Lift-OFF TEST (m-ELT) Method]

(1) Formation of a Silica Based Coating Film for $K_1$ Evaluation

First, the composition for forming the silica based coating film is coated onto a prescribed Si wafer to a specified thickness to form a coating. More specifically, an 8-inch Si wafer (thickness: 725±25 μm) is coated with the composition for forming of a silica based coating film to a thickness of 0.5-0.6 μm by a spin coating method to form a coating. The Si wafer is then heat treated under conditions of 150° C./1 min+250° C./1 min, for removal of the solvent in the composition to accomplish precuring, and is then heat treated at 400° C./30 min) in a nitrogen ($N_2$) gas atmosphere for final curing, to form a silica based coating film.

(2) Evaluation of $K_1$ Value Parameter

The test piece used for the following measurement was the 3.5 cm×7 cm center section of an 8-inch Si wafer with the silica based coating film formed thereon. First, the thickness h1 of the test piece is measured by a Union Tool Microfine.

Next, a UV-ozone treatment apparatus (UV Dry Processor VUM-3073-B, by Ooku Laboratories) is used for 150 seconds of treatment of the test piece surface, and then Omega99 Epoxy by Frontier Semiconductor is coated to a thickness of about 200 μm using a BYK-Gardner Film Casting Knife. The test piece is then dried for 1 hour with a Hazardous Material High-Temperature Drier (EHT-H02 ETAC, product of Kusumoto Kasei) kept at 177° C.

Next, the test piece is cut to a 1 cm square with a diamond cutter, and the thickness h2 at the corner (tip) is measured by the aforementioned apparatus used for measurement of h1. A test piece cut to a 1 cm square is placed on the stage in the chamber of an m-ELT apparatus (by Modern Metalcraft), and upon lowering the temperature according to the following temperature program:

Temperature-lowering initial temperature: 100° C.
Temperature-lowering final temperature: −175° C.
Temperature-lowering speed: 3° C./min, the temperature T(° C.) at which the coated epoxy resin peeled is read off.

The obtained thicknesses h1, h2 and temperature T are used to calculate the $K_1$ value from the relationship represented by the following formulas (5) and (6):

$$K_1 = \sigma \times \{(h1-h2)/2\}^{1/2} \tag{5}$$

$$\sigma = -0.0002 \times T^2 - 0.192 \times T + 24.0 \tag{6}$$

The $K_1$ parameter for the m-ELT obtained in this manner is an index representing the adhesion between the silica based coating film and base layer and the strength of the film itself, with a larger $K_1$ value indicating higher adhesive strength (cohesive strength) between the silica based coating film and base layer, and superior film strength.

If the $K_1$ value is less than 0.2, application of the silica based coating film as an interlaminar insulating film in a Cu-damascene process will result in inconveniently weak cohesion between the coating and the underlying $SiO_2$ film, and can also result in the serious problems of delamination or clumping and destruction of the film itself during the Cu-CMP step in which the excess Cu film produced upon lamination of the wiring metal is polished.

Specifically, the composition for forming a silica based coating film preferably comprises component (a): siloxane resin obtained by hydrolytic condensation of a compound represented by the following formula (1):

$$R^1{}_n SiX_{4-n} \tag{1}$$

(wherein $R^1$ represents an H atom or F atom, a group containing a B atom, N atom, Al atom, P atom, Si atom, Ge atom or Ti atom, or a C1-20 organic group, X represents a hydrolyzable group, and n represents an integer of 0-2, with the proviso that when n is 2, each $R^1$ may be the same or different, and when n is 0-2, each X may be the same or different), component (b): a solvent capable of dissolving component (a), component (c): an onium salt, and component (d): a thermal decomposing/volatile compound which undergoes thermal decomposition or volatilization at a heating temperature of 250-500° C.

When curing proceeds by heating of this type of composition, the thermal decomposition or volatilization of component (d) results in gradual formation of fine pores in the film to allow uniformity of porosity and shape during the final curing. In addition, the presence of the onium salt as component (c) promotes the dehydrating condensation reaction of the compound represented by (1), reducing the number of Si—OH bonds to increase the density of siloxane bonds. In addition, the process of pore formation, the high densification of siloxane bonds and the annealing effect during the final heating act in combination to cause a relaxation of stress in the film. However, the effect is not limited to that described above.

Component (a) comprises at least one species of atom selected from the group consisting of H, F, B, N, Al, P, Si, Ge, Ti and C atoms at preferably no more than 0.65 mole, more preferably no more than 0.55 mole, even more preferably no more than 0.50 mole and most preferably no more than 0.45 mole as the total proportion with respect to 1 mole of Si atoms. The lower limit for the total proportion is preferably about 0.20. This will prevent reduction in the adhesion for other films (layers) and the mechanical strength of the silica based coating film.

The present inventors also carried out diligent research from the standpoint of the material components and composition used to obtain a silica based coating film as an insulating film, and completed the present invention upon discovering that a composition comprising specific components can solve the various problems of the prior art.

Specifically, the composition for forming silica based coating film preferably comprises component (a): siloxane resin obtained by hydrolytic condensation of a compound represented by the following formula (1):

$$R^1{}_n SiX_{4-n} \tag{1}$$

component (b): a solvent composed of a first solvent component comprising an alkyleneglycol alkyl ether alkyl ester or alkyleneglycol alkyl ether acetate and a second solvent component comprising an alkyleneglycol monoalkyl ether, component (e): a polymer with a side chain containing a hydroxyl group, and component (c): an onium salt (onium compound), wherein the polymer of component (e) satisfies the relationship represented by the following inequality (2):

$$0 < M_{OH} < 0.4 \times 10^{-2} \qquad (2).$$

In formula (1), $R^1$ represents an H atom or F atom, a group containing a B atom, N atom, Al atom, P atom, Si atom, Ge atom or Ti atom, or a C1-20 organic group, X represents a hydrolyzable group, and n represents an integer of 0-2, with the proviso that when n is 2, each $R^1$ may be the same or different, and when n is 0-2, each X may be the same or different. In inequality (2), $M_{OH}$ represents the concentration (mol/g) of hydroxyl groups in the polymer of component (e).

The composition having this construction is coated onto a substrate such as a wafer and heated for curing, to form a silica based coating film exhibiting a low permittivity (Low-k film). The solvent of component (b) comprises a first solvent component and a second solvent component, and the finally obtained silica based coating film was confirmed to exhibit adequate mechanical strength.

Since the polymer of component (e) contains hydroxyl groups on the side chains, it is possible to prevent layer separation between the siloxane resin of component (a) and the polymer upon volatilization of the solvent of component (b), and to thus achieve miniaturization of the pores formed in the film and uniformity of the shape. Furthermore, decomposition of component (e) during the heating is inhibited, and its volatilization is accelerated.

The presence of the onium salt as component (c) promotes the dehydrating condensation reaction of the compound represented by (1), reducing the number of Si—OH bonds to increase the density of siloxane bonds, thereby further improving the mechanical strength. However, the effect is not limited to that described above.

Component (a) comprises at least one species of atom selected from the group consisting of H, F, B, N, Al, P, Si, Ge, Ti and C atoms at preferably no more than 0.65 mole, more preferably no more than 0.55 mole, even more preferably no more than 0.50 mole and most preferably no more than 0.45 mole as the total proportion with respect to 1 mole of Si atoms. The lower limit for the total proportion is preferably about 0.20. This will prevent reduction in the adhesion for other films (layers) and the mechanical strength of the silica based coating film.

The mass fraction of the first solvent component and second solvent component in component (b) is preferably 1:99-60:40. This will adequately minimize reduction in the mechanical strength of the silica based coating film, while preventing deterioration in the physical properties such as film thickness uniformity.

Specifically, it is effective if the first solvent component is an alkyleneglycol methyl ether acetate or propyleneglycol alkyl ether acetate, and particularly propyleneglycol methyl ether acetate. Alternatively, the second solvent component may be propyleneglycol monopropyl ether.

The reduction percentage of component (e) in the nitrogen gas atmosphere at a temperature of 300-500° C. is preferably 95 wt % or greater, more preferably 97 wt % or greater and more preferably 99 wt % or greater. Component (e) of this type will adequately minimize residue of the polymer or polymer reaction product in the finally obtained silica based coating film when the composition is heated.

Component (e) even more preferably contains an ester bond in the molecule. This will further accelerate decomposition or volatilization of the polymer when the composition is heated.

In addition, it is effective if component (e) comprises a (meth)acrylic acid derivative as a constituent component, with the (meth)acrylic acid derivative content at $0.5 \times 10^{-2}$ (mol/g) or greater. This will afford an advantage by further accelerating decomposition or volatilization of the polymer when the composition is heated.

There are no particular restrictions on the onium salt of component (c), but an ammonium salt is useful from the standpoint of further improving the electrical and mechanical properties of the resulting silica based coating film and increasing the stability of the composition.

More preferably, the composition for forming a silica based coating film according to the invention additionally contains nitric acid. The nitric acid in this case will function as a catalyst to accelerate the hydrolytic condensation reaction for hydrolytic condensation of the compound represented by formula (1) Although substances other than nitric acid exist which exhibit a catalytic function, the use of nitric acid can increase the hardness of the silica based coating film obtained by heat curing. It is also preferred from the standpoint of achieving a lower permittivity.

The silica based coating film of the invention is composed of a cured film which is formed by applying the composition for forming a silica based coating film according to the invention onto a substrate such as an Si wafer, and heating the applied coating.

As mentioned above, the silica based coating film of the invention obtained from the composition for forming a silica based coating film of the invention has a specific permittivity of less than 3.0, preferably no greater than 2.7, more preferably no greater than 2.5 and even more preferably no greater than 2.2. Thus, the specific permittivity of the silica based coating film is preferably smaller from the standpoint of use as an interlaminar insulating film, but in order to prevent reduction in the mechanical strength of the film, the lower limit is preferably about 1.5.

[Specific Permittivity Measurement Method]

The "specific permittivity" of the silica based coating film of the invention is the value measured at 23° C.±2° C., 40±10% humidity, and it is determined by measuring the charge capacity between Al metal and an N-type low resistivity board (Si wafer). First, the silica based coating film for measurement of the specific permittivity is formed.

For example, the composition for forming a silica based coating film is applied onto an N-type low resistivity Si wafer (resistivity<10 Ωcm) by a spin coating method to a film thickness of 0.5-0.6 μm to form a coating. The solvent in the composition is then removed using a hotplate heated to 200° C., and heating is then performed in a nitrogen ($N_2$) gas atmosphere at 400° C. for 30 minutes for final curing to form a silica based coating film.

Next, Al metal is vapor deposited onto the silica based coating film in a 2 mm-diameter circle at a thickness of about 0.1 μm, using a vapor deposition apparatus. This forms a structure with an insulating film situated between Al metal and a low resistivity substrate. The charge capacity of the structure is then measured using an apparatus assembled by connecting a dielectric test fixture (HP16451B, product of Yokogawa Denki) to an LF impedance analyzer (HP4192A, product of Yokogawa Denki), at a use frequency of 1 MHz.

The measured value for the charge capacity is substituted into the following formula (7):

Silica based coating film specific permittivity=3.597×10$^{-2}$×charge capacity($pF$)×film thickness($\mu m$)   (7), to calculate the specific permittivity of the silica based coating film.

Incidentally, although the silica based coating film of the invention has excellent low permittivity as mentioned above, even lower permittivity can be effectively achieved by, for example, adjusting the content of component (d) in the composition to increase the introduction of fine pores in the film.

However, if the introduction of fine pores is excessively increased, care must be taken to avoid reducing the mechanical strength of the film. From this standpoint, it is preferred to form the silica based coating film using a composition for forming a silica based coating film which originally yields a film with an extremely low specific permittivity even without introduction of fine pores.

The elastic modulus of the silica based coating film is preferably 2.5 GPa or greater, more preferably 3.0 GPa or greater, even more preferably 3.5 GPa or greater, particularly preferably 4.0 GPa or greater and most preferably 4.5 GPa or greater.

The upper limit is not particularly restricted, but will normally be about 30 GPa. An elastic modulus of less than 2.5 GPa may result in inconveniences such as working difficulties when the silica based coating film is used as a semiconductor insulating film, for example.

In order to increase the elastic modulus, it is effective to reduce the proportion of pores in the siloxane resin, for example, but since it is advantageous to increase the pore volume in the film from the standpoint of lowering the specific permittivity as mentioned above, it is therefore preferred to achieve a satisfactory balance between the two.

[Elastic Modulus Measurement Method]

The "elastic modulus" of the silica based coating film of the invention is the elastic modulus near the surface of the film, and it is the value measured using a DCM nanoindenter by MTS Co. The silica based coating film used for measurement is one fabricated in the same manner as explained under "Specific permittivity measurement method" above. If the silica based coating film thickness is too thin it will be affected by the base, and therefore as mentioned above, the initial coating thickness is preferably 0.5-0.6 μm.

"Near the surface" means a depth of no greater than 1/10 of the film thickness, and more specifically it is a position at a depth of 15-50 nm from the film surface. The load and load speed for the measurement are varied to satisfy the relationship represented by the following formula (8):

$dL/dt \times 1/L = 0.05(\sec^{-1})$   (8)

In the formula, L represents the load, and t represents the time. A Berkovich indenter (material: diamond) was used as the indenter for indentation, and the amplitude-frequency of the indenter was set to 45 Hz for the measurement.

The silica based coating film of the invention even more preferably has (numerous) pores formed therein having a mean pore size of preferably no greater than 4.0 nm, more preferably no greater than 3.0 nm and most preferably no greater than 2.2 nm. It will thus be possible to reliably achieve sufficient mechanical strength such as CMP resistance, and satisfactory lower permittivity. In this case, the mean pore size is preferably such a size which does not hamper formation of the pores. If the mean pore size is too small, it becomes difficult to achieve the required low permittivity.

Alternatively, the pore size of maximum frequency among the pores formed in the silica based coating film is preferably no greater than 2.0 nm, and more preferably no greater than 1.5 nm. This will facilitate achievement of both sufficient mechanical strength and low permittivity.

The "mean pore size" according to the invention is the average value of the pore size as determined from the pore distribution measured by small angle X-ray scattering analysis using a commonly employed X-ray diffraction apparatus, for a thin-film of the silica based coating. The "pore size of maximum frequency" is the pore size which is found at the greatest frequency in the pore distribution measured in the same manner.

In addition, it is preferred for there to be substantially no pores present having a size of 10 nm or more, or in other words, that the maximum value for the formed pore size be less than 10 nm. Specifically, the maximum pore size in the pore distribution as measured in the manner described above is preferably less than 10 nm. This will adequately prevent generation and propagation of cracks in the film originating from pores, and thus film breakage. The term "substantially not present" includes not only cases where the frequency in the pore distribution is zero, but also cases where it is judged to be statistically below the detection limit of the measuring apparatus.

The method for preparation of the silica based coating film of the invention is characterized by applying a composition for forming a silica based coating film according to the invention onto a substrate and heating the applied coating to harden the coating. More specifically, the method for preparation of the silica based coating film of the invention is characterized by applying a composition for forming a silica based coating film according to the invention onto a substrate, removing the solvent in the applied coating, and then firing the coating at a heating temperature of 250-500° C.

Also, an electronic part (device) according to the invention has an insulating film formed on a substrate having the structure of an element, wherein the insulating film is a silica based coating film produced by the method for preparation of a silica based coating film according to the invention, or a film comprising the silica based coating film.

DETAILED DESCRIPTION OF THE INVENTION

Figure 1:
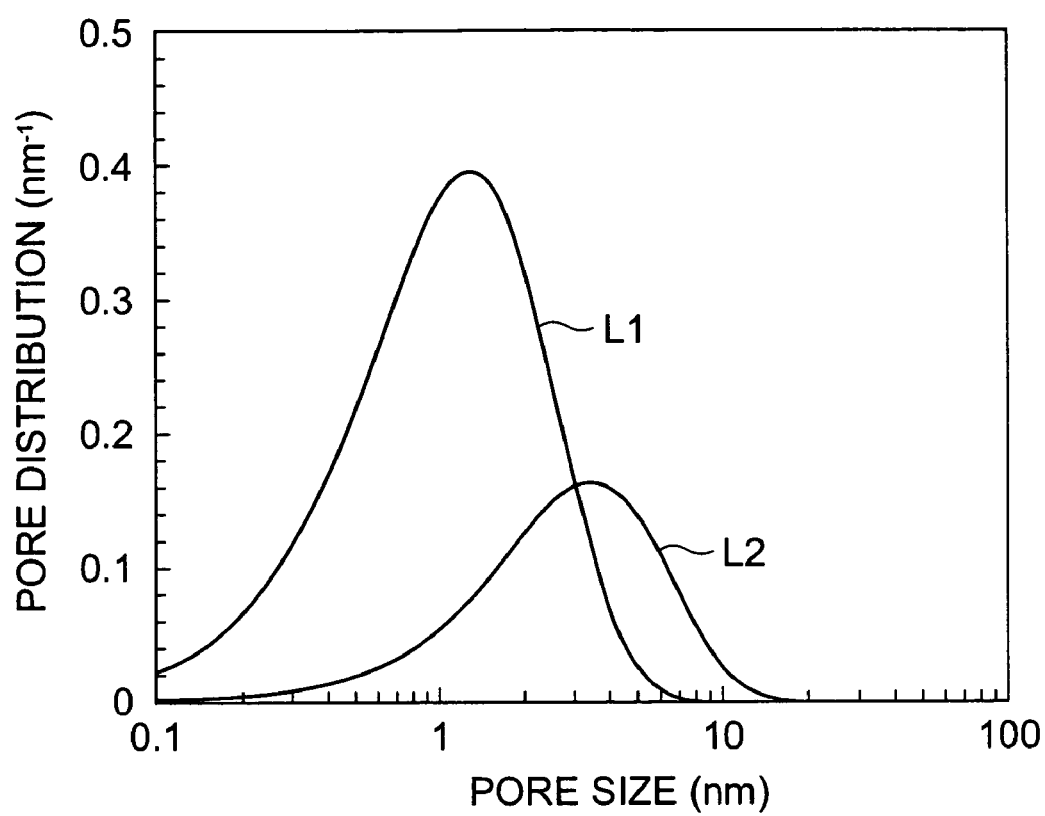
FIG. 1 is a graph showing the pore distribution for the silica based coating film of Example 1-2 and of a prior art product.

Embodiments of the present invention will now be explained in detail. As explained above, the composition for forming silica based coating film according to the invention comprises siloxane resin, is fluid and forms a silica based coating film by curing upon application of heat when the film is coated onto a substrate, and it has curing properties such that the stress of the silica based coating film upon precuring by heating at 150° C. for 3 minutes is 10 MPa or greater, and the specific permittivity of the silica based coating film obtained by the final curing is less than 3.0.

Thus, heat treatment at a low temperature of about 150° C. and for a short time of about several minutes initiates formation of a siloxane skeleton in the film, to allow a certain degree of curing, i.e. precuring. Since the curing is carried out at in a lower temperature range and for a shorter time than in the prior art, it is possible to reduce the heat input into the wafer or other substrate coated with the composition. It is therefore possible to reduce the effect of heat on the underlying wiring layer, etc. Moreover, since the final curing treatment can be carried out at a higher temperature in a shorter period of time, heat input can be further alleviated.

As explained above, the composition for forming silica based coating film according to the invention alternatively comprises siloxane resin, is fluid and forms a silica based coating film by curing upon application of heat when the film is coated onto a substrate, and has a curing property such that when the film is subjected to precuring at a first heating temperature and then subjected to final curing at a second heating temperature higher than the first heating temperature, the second stress of the silica based coating film resulting from the final curing at the second heating temperature is less than the first stress of the silica based coating film resulting from the precuring at the first heating temperature.

Consequently, this manner of composition for forming silica based coating film has reduced stress when the coating formed by heat treatment at the first heating temperature before the final curing is subjected to final curing at the second heating temperature. This prevents the effect of rapid stress on the resulting silica based coating film.

Moreover, since precuring can be carried out in a low temperature range before the final curing, the heat treatment can be accomplished in a short time at a higher temperature than the final curing treatment. Thus, it is possible to reduce the heat input into the wafer or other substrate coated with the composition. The effect of heat on the underlying wiring layer, etc. can therefore be reduced. In addition, since stress of the silica based coating film can be alleviated, it is possible to improve adhesion with the other layers (films).

As described above, the composition for forming silica based coating film according to the invention also alternatively comprises siloxane resin, is fluid and forms a silica based coating film by curing upon application of heat when the film is coated onto a substrate, and has a curing property such that the value of parameter $K_1$ as determined by m-ELT is 0.20 or greater, preferably 0.25 or greater, more preferably 0.27 or greater and most preferably 0.29 or greater, and the specific permittivity of the silica based coating film obtained by the final curing is less than 3.0. The upper limit for $K_1$ is preferably about 0.6.

When the silica based coating film obtained from such a composition is used as an interlaminar insulating film for an electronic part such as a semiconductor device, the adhesion with lower or upper layers (other films) and the strength of the film itself is vastly improved over the prior art. Consequently, the delamination resistance during polishing and the resistance to clumping and destruction of the film is increased at the interface with, for example, an SiC film or the like used as a cap film, or at the interface with an underlying $SiO_2$ film, and it is possible to inhibit delamination at interfaces during CMP steps, or clumping and destruction of the film.

First Embodiment

As a specific composition used as the composition for forming silica based coating film of the invention, there may be mentioned one comprising the following components (a), (b), (c) and (d) as essential components.

<Component (a)>

Component (a) is siloxane resin obtained by hydrolytic condensation of a compound represented by the following formula (1):

$$R^1{}_nSiX_{4-n} \tag{1}$$

Here, $R^1$ represents an H atom or F atom, a group containing a B atom, N atom, Al atom, P atom, Si atom, Ge atom or Ti atom, or a C1-20 organic group, X represents a hydrolyzable group, and n represents an integer of 0-2, with the proviso that when n is 2, each $R^1$ may be the same or different, and when n is 0-2, each X may be the same or different.

As examples of the hydrolyzable group X there may be mentioned alkoxy groups, halogen atoms, acetoxy groups, isocyanate groups, hydroxyl, and the like. Among these, alkoxy groups are preferred from the standpoint of liquid stability of the composition itself and coating application properties.

As examples of compounds of formula (1) wherein the hydrolyzable group X is alkoxy (alkoxysilanes), there may be mentioned tetraalkoxysilanes such as tetramethoxysilane, tetraethoxysilane, tetra-n-propoxysilane, tetra-iso-propoxysilane, tetra-n-butoxysilane, tetra-sec-butoxysilane, tetra-tert-butoxysilane and tetraphenoxysilane, trialkoxysilanes such as trimethoxysilane, triethoxysilane, tripropoxysilane, fluorotrimethoxysilane, fluorotriethoxysilane, methyltrimethoxysilane, methyltriethoxysilane, methyltri-n-propoxysilane, methyltri-iso-propoxysilane, methyltri-n-butoxysilane, methyltri-iso-butoxysilane, methyltri-tert-butoxysilane, methyltriphenoxysilane, ethyltrimethoxysilane, ethyltriethoxysilane, ethyltri-n-propoxysilane, ethyltri-iso-propoxysilane, ethyltri-n-butoxysilane, ethyltri-iso-butoxysilane, ethyltri-tert-butoxysilane, ethyltriphenoxysilane, n-propyltrimethoxysilane, n-propyltriethoxysilane, n-propyltri-n-propoxysilane, n-propyltri-iso-propoxysilane, n-propyltri-n-butoxysilane, n-propyltri-iso-butoxysilane, n-propyltri-tert-butoxysilane, n-propyltriphenoxysilane, iso-propyltrimethoxysilane, iso-propyltriethoxysilane, iso-propyltri-n-propoxysilane, iso-propyltri-iso-propoxysilane, iso-propyltri-n-butoxysilane, iso-propyltri-iso-butoxysilane, iso-propyltri-tert-butoxysilane, iso-propyltriphenoxysilane, n-butyltrimethoxysilane, n-butyltriethoxysilane, n-butyltri-n-propoxysilane, n-butyltri-iso-propoxysilane, n-butyltri-n-butoxysilane, n-butyltri-iso-butoxysilane, n-butyltri-tert-butoxysilane, n-butyltriphenoxysilane, sec-butyltrimethoxysilane, sec-butyltriethoxysilane, sec-butyltri-n-propoxysilane, sec-butyltri-iso-propoxysilane, sec-butyltri-n-butoxysilane, sec-butyltri-iso-butoxysilane, sec-butyltri-tert-butoxysilane, sec-butyltriphenoxysilane, t-butyltrimethoxysilane, t-butyltriethoxysilane, t-butyltri-n-propoxysilane, t-butyltri-iso-propoxysilane, t-butyltri-n-butoxysilane, t-butyltri-iso-butoxysilane, t-butyltri-tert-butoxysilane, t-butyltriphenoxysilane, phenyltrimethoxysilane, phenyltriethoxysilane, phenyltri-n-propoxysilane, phenyltri-iso-propoxysilane, phenyltri-n-butoxysilane, phenyltri-iso-butoxysilane, phenyltri-tert-butoxysilane, phenyltriphenoxysilane, trifluoromethyltrimethoxysilane, pentafluoroethyltrimethoxysilane, 3,3,3-trifluoropropyltrimethoxysilane and 3,3,3-trifluoropropyltriethoxysilane, and diorganodialkoxysilanes such as dimethyldimethoxysilane, dimethyldiethoxysilane, dimethyldi-n-propoxysilane, dimethyldi-iso-propoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldi-iso-propoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldi-iso-propoxysilane, di-n-propyldi-n-butoxysilane, di-n-propyldi-sec-butoxysilane, di-n-propyldi-tert-butoxysilane, di-n-propyldiphenoxysilane, di-iso-propyldimethoxysilane, di-iso-propyldiethoxysilane, di-iso-propyldi-n-propoxysilane, di-iso-propyldi-iso-propoxysilane, di-iso-propyldi-n-butoxysilane, di-iso-propyldi-sec-butoxysilane, di-iso-propyldi-tert-butoxysilane, di-iso-propyldiphenoxysilane, di-n-butyldimethoxysilane, di-n-butyldiethoxysilane, di-n-butyldi-n-propoxysilane, di-n-butyldi-iso-propoxysilane, di-n-butyldi-n-butoxysilane, di-n-butyldi-sec-butoxysilane, di-n-butyldi-tert-butoxysilane, di-n-butyldiphenoxysilane, di-sec-butyldimethoxysilane, di-sec-butyldiethoxysilane, di-sec-butyldi-n-propoxysilane, di-sec-butyldi-iso-propoxysilane, di-sec-butyldi-n-butoxysilane, di-sec-butyldi-sec-butoxysilane, di-sec-butyldi-tert-butoxysilane, di-sec-butyldiphenoxysilane, di-tert-butyldimethoxysilane, di-tert-butyldiethoxysilane, di-tert-butyldi-n-propoxysilane, di-tert-butyldi-iso-propoxysilane, di-tert-butyldi-n-butoxysilane, di-tert-butyldi-sec-butoxysilane, di-tert-butyldi-tert-butoxysilane, di-tert-butyldiphenoxysilane, diphenyldimethoxysilane, diphenyldiethoxysilane, diphenyldi-n-propoxysilane, diphenyldi-iso-propoxysilane, diphenyldi-n-butoxysilane, diphenyldi-sec-butoxysilane, diphenyldi-tert-butoxysilane, diphenyldiphenoxysilane, bis(3,3,3-trifluoropropyl)dimethoxysilane and methyl(3,3,3-trifluoropropyl)dimethoxysilane.

As examples of compounds of formula (1) wherein the hydrolyzable group X is a halogen atom (halogenated silanes), there may be mentioned the alkoxysilanes mentioned above wherein the alkoxy group is substituted with a halogen atom.

As examples of compounds of formula (1) wherein the hydrolyzable group X is an acetoxy group (acetoxysilanes), there may be mentioned the alkoxysilanes mentioned above wherein the alkoxy group is substituted with an acetoxy group.

As examples of compounds of formula (1) wherein the hydrolyzable group X is an isocyanate group (isocyanatosilanes), there may be mentioned the alkoxysilanes mentioned above wherein the alkoxy group is substituted with an isocyanate group.

As examples of compounds of formula (1) wherein the hydrolyzable group X is hydroxyl (hydroxysilanes), there may be mentioned the alkoxysilanes mentioned above wherein the alkoxy group is substituted with hydroxyl.

The compounds represented by formula (1) may be used alone or in combinations of two or more.

As catalysts to promote the hydrolytic condensation reaction for hydrolytic condensation of the compound represented by formula (1), there may be used organic acids such as formic acid, maleic acid, fumaric acid, acetic acid, propionic acid, butanoic acid, pentanoic acid, hexanoic acid, heptanoic acid, octanoic acid, nonanoic acid, decanoic acid, oxalic acid, adipic acid, sebacic acid, butyric acid, oleic acid, stearic acid, linolic acid, linoleic acid, salicylic acid, benzoic acid, p-aminobenzoic acid, p-toluenesulfonic acid, phthalic acid, sulfonic acid, tartaric acid and trifluoromethanesulfonic acid, or inorganic acids such as hydrochloric acid, phosphoric acid, nitric acid, boric acid, sulfuric acid and hydrofluoric acid.

The amount of catalyst used is preferably in the range of 0.0001-1 mole per mole of the compound represented by formula (1). An amount of greater than 1 mole will tend to promote gelling during the hydrolytic condensation, while an amount of less than 0.0001 mole will tend to substantially prevent the reaction from proceeding.

During the reaction, the alcohol by-product of the hydrolysis may be removed using an evaporator or the like if necessary. Also, although the water volume in the hydrolytic condensation reaction system may be appropriately adjusted, it is preferably a value in the range of 0.5-20 moles to 1 mole of the compound represented by formula (1). If the water volume is less than 0.5 mole or greater than 20 moles, the film-forming property of the silica based coating film may be impaired, and the storage stability of the composition itself may be lower.

From the standpoint of solubility in the solvent, mechanical property, shapeability, etc., the siloxane resin used as component (a) preferably has a weight-average molecular weight of 500-20,000 and more preferably 1000-10,000, as measured by gel permeation chromatography (hereinafter "GPC") and calculated using a standard polystyrene calibration curve. If the weight-average molecular weight is less than 500, the shapeability of the silica based coating film will tend to be inferior. On the other hand, if the weight-average molecular weight is greater than 20,000, the solvent compatibility will tend to be lower.

Also, the total number (M) of at least one species of atom selected from the group consisting of H, F, B, N, Al, P, Si, Ge, Ti and C atoms (hereinafter referred to as "specific bonded atoms") bonded per Si atom of the siloxane resin is preferably no greater than 0.65, more preferably no greater than 0.55, even more preferably no greater than 0.50 and especially no greater than 0.45. The lower limit is preferably about 0.20.

If the total number (M) of specific bonded atoms is greater than 0.65, the adhesion of the finally obtained silica based coating film with other films (layers) and the mechanical strength will tend to be inferior. On the other hand, if the total number (M) is less than 0.20, the dielectric properties for use as an insulating film will tend to be inferior.

Of these specific bonded atoms, the siloxane resin preferably comprises at least one species from among H, F, N, Si, Ti and C atoms from the standpoint of the film-forming property of the silica based coating film, and more preferably it comprises at least one species from among H, F, N, Si and C atoms from the standpoint of dielectric properties and mechanical strength.

The total number (M) may be determined from the charging volume of the siloxane resin as component (a), and for example, it may be calculated using the relationship represented by the following formula (6):

$$M=(M1+(M2/2)+(M3/3))/Msi \quad (6).$$

In the formula, M1 represents the total number of atoms of the specific bonded atoms bonded to a single (only one) Si atom, M2 represents the total number of atoms of the specific bonded atoms shared by two silicon atoms, M3 represents the total number of atoms of the specific bonded atoms shared by three silicon atoms, and Msi represents the total number of Si atoms.

<Component (b)>

Component (b) is a solvent capable of dissolving component (a), i.e. the siloxane resin, and examples of such solvents include alcoholic solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, n-octanol, 2-ethylhexanol, sec-octanol, n-nonylalcohol, n-decanol, sec-undecylalcohol, trimethylnonylalcohol, sec-tetradecylalcohol, sec-heptadecylalcohol, phenol, cyclohexanol, methylcyclohexanol, benzylalcohol, ethylene glycol, 1,2-propylene glycol, 1,3-butylene glycol, diethylene glycol, dipropylene glycol, triethylene glycol and tripropylene glycol; ketone-based solvents such as acetone, methylethylketone, methyl-n-propylketone, methyl-n-butylketone, methyl-iso-butylketone, methyl-n-pentylketone, methyl-n-hexylketone, diethylketone, di-iso-butylketone, trimethylnonanone, cyclohexanone, cyclopentanone, methylcyclohexanone, 2,4-pentanedione, acetonylacetone, diacetone alcohol, acetophenone and γ-butyrolactone; ether-based solvents such as ethyl ether, iso-propyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethyleneglycol monoethyl ether, ethyleneglycol diethyl ether, ethyleneglycol mono-n-hexyl ether, ethyleneglycol monophenyl ether, ethyleneglycol mono-2-ethylbutyl ether, ethyleneglycol dibutyl ether, diethyleneglycol monoethyl ether, diethyleneglycol diethyl ether, diethyleneglycol diethyl ether, diethyleneglycol mono-n-butyl ether, diethyleneglycol di-n-butyl ether, diethyleneglycol mono-n-hexyl ether, ethoxytriglycol, tetraethyleneglycol di-n-butyl ether, propyleneglycol monomethyl ether, propyleneglycol monoethyl ether, propyleneglycol monopropyl ether, dipropyleneglycol monomethyl ether, dipropyleneglycol monoethyl ether, tripropyleneglycol monomethyl ether, tetrahydrofuran and 2-methyltetrahydrofuran; ester-based solvents such as methyl acetate, ethyl acetate, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, nonyl acetate, γ-butyrolactone, γ-valerolactone, methyl acetoacetate, ethyl acetoacetate, ethyleneglycol monomethyl ether acetate, ethyleneglycol monoethyl ether acetate, diethyleneglycol monomethyl ether acetate, diethyleneglycol monoethyl ether acetate, diethyleneglycol mono-n-butyl ether acetate, propyleneglycol monomethyl ether acetate, propyleneglycol monoethyl ether acetate, propyleneglycol monopropyl ether acetate, dipropyleneglycol monomethyl ether acetate, dipropyleneglycol monoethyl ether acetate, glycol diacetate, methoxytriglycol acetate, ethyl propionate, n-butyl propionate, i-amyl propionate, diethyl oxalate, di-n-butyl oxalate, methyl lactate, ethyl lactate, n-butyl lactate and n-amyl lactate; and other solvents such as acetonitrile, N,N-dimethylformamide, N,N-dimethylacetamide and N,N-dimethyl sulfoxide. These may be used alone or in combinations of two or more.

The amount of solvent (component (b)) used is preferably an amount such that the amount of component (a) (siloxane resin) is 3-25 wt %. If the amount of solvent is so little as to increase the concentration of component (a) above 25 wt %, the shapeability of the silica based coating film may be impaired, and the storage stability of the composition itself will tend to be lower. On the other hand, if the amount of solvent is so great as to decrease the concentration of component (a) below 3 wt %, it will tend to be difficult to form a silica based coating film to the desired thickness.

<Component (c)>

Component (c) is an onium salt, and as examples there may be mentioned ammonium salts, phosphonium salts, arsonium salts, stibonium salts, oxonium salts, sulfonium salts, selenonium salts, stannonium salts, iodonium salts and the like.

Ammonium salts are preferred among these from the standpoint of more excellent stability of the composition, and as examples there may be mentioned tetramethylammonium oxide, tetramethylammonium chloride, tetramethylammonium bromide, tetramethylammonium fluoride, tetrabutylammonium oxide, tetrabutylammonium chloride, tetrabutylammonium bromide, tetrabutylammonium fluoride, tetramethylammonium nitrate, tetramethylammonium acetate, tetramethylammonium propionate, tetramethylammonium maleate and tetramethylammonium sulfate.

Particularly preferred among these from the standpoint of improving the electrical properties of the silica based coating film are tetramethylammonium nitrate, tetramethylammonium acetate, tetramethylammonium propionate, tetramethylammonium maleate and tetramethylammonium sulfate.

The amount of onium salt used as component (c) is preferably 0.001 ppm to 5%, more preferably 0.01 ppm to 1% and even more preferably 0.1 ppm to 0.5%, with respect to the total volume of the composition for formation of the silica based coating film.

If the amount used is less than 0.001 ppm, the electrical and mechanical properties of the finally obtained silica based coating film will tend to be inferior. On the other hand, if the amount used is greater than 5%, the stability and film-forming property of the composition will tend to be inferior, and the electrical properties and process adaptability of the silica based coating film will tend to be reduced. These onium salts may be added to the prescribed concentration after dissolution or dilution with water or a solvent, if necessary.

When the onium salt is used as an aqueous solution, the pH is preferably 1.5-10, more preferably 2-8 and especially 3-6. If the pH is below 1.5 or above 10, the stability and film-forming property of the composition will tend to be inferior.

<Component (d)>

Component (d) is a thermal decomposing/volatile compound which undergoes thermal decomposition or volatilization at a heating temperature of 250-500° C., and as examples there may be mentioned polymers having a polyalkylene oxide structure, (meth)acrylate-based polymers, polyester polymers, polycarbonate polymers, polyanhydride polymers and tetrakissilanes.

Examples of polyalkylene oxide structures include a polyethylene oxide structure, polypropylene oxide structure, polytetramethylene oxide structure and polybutylene oxide structure.

More specifically, there may be mentioned ether compounds such as polyoxyethylene alkyl ether, polyoxyethylene sterol ether, polyoxyethylene lanolin derivatives, ethylene oxide derivative of alkylphenyl formalin, polyoxyethylene polyoxypropylene block copolymer and polyoxyethylene polyoxypropylene alkyl ether, ether ester compounds such as polyoxyethylene glycerin fatty acid ester, polyoxyethylene sorbitol fatty acid ester and polyoxyethylene fatty acid alkanolamide sulfate, and ether ester compounds such as polyethyleneglycol fatty acid esters, ethyleneglycol fatty acid esters, fatty acid monoglycerides, polyglycerin fatty acid esters, sorbitan fatty acid esters and propyleneglycol fatty acid esters.

As acrylic acid esters and methacrylic acid esters composing (meth)acrylate-based polymers there may be mentioned acrylic acid alkyl esters, methacrylic acid alkyl esters, acrylic acid alkoxyalkyl esters, methacrylic acid alkyl esters and methacrylic acid alkoxyalkyl esters.

Examples of acrylic acid alkyl esters include C1-6 alkyl esters such as methyl acrylate, ethyl acrylate, n-propyl acrylate, isopropyl acrylate, n-butyl acrylate, isobutyl acrylate, pentyl acrylate and hexyl acrylate.

Examples of methacrylic acid alkyl esters include C1-6 alkyl esters such as methyl methacrylate, ethyl methacrylate, n-propyl methacrylate, isopropyl methacrylate, n-butyl methacrylate, isobutyl methacrylate, pentyl methacrylate and hexyl methacrylate.

Examples of acrylic acid alkoxyalkyl esters include methoxymethyl acrylate and ethoxyethyl acrylate, and as methacrylic acid alkoxyalkyl esters there may be mentioned methoxymethyl methacrylate and ethoxyethyl methacrylate.

As acrylic and methacrylic acids with hydroxyl groups there may be mentioned 2-hydroxyethyl acrylate, 2-hydroxypropyl acrylate, 2-hydroxyethyl methacrylate and 2-hydroxypropyl methacrylate. (Meth)acrylic acids, (meth) acrylic acid alkyl esters, (meth)acrylic acid alkoxyalkyl esters and (meth)acrylic acids with hydroxyl groups, as constituents of (meth)acrylate-based polymers, may be used alone or in combinations of two or more.

As polycarbonates there may be mentioned polycondensation products of carbonic acid and alkylene glycols, such as polyethylene carbonate, polypropylene carbonate, polytrimethylene carbonate, polytetramethylene carbonate, polypentamethylene carbonate and polyhexamethylene carbonate.

As polyanhydrides there may be mentioned polycondensation products of dicarboxylic acids, such as polymalonyl oxide, polyadipoyl oxide, polypimeloyl oxide, polysuberoyl oxide, polyazeloyl oxide and polysebacoyl oxide.

In addition, as tetrakissilanes there may be mentioned tetrakis(trimethylsiloxy)silane, tetrakis(trimethylsilyl)silane, tetrakis(methoxyethoxy)silane, tetrakis(methoxyethoxyethoxy)silane and tetrakis(methoxypropoxy)silane.

If the thermal decomposing/volatile compound as component (d) is a compound which thermally decomposes or volatilizes at a temperature of below 250° C., it will thermally decompose and volatilize before formation of the siloxane skeleton, potentially making it impossible to obtain the desired dielectric property. On the other hand, if the thermal decomposing/volatile compound as component (d) is a compound which thermally decomposes or volatilizes at a temperature of above 500° C., it may result in deterioration of the wiring metal. Thus, a compound which thermally decomposes or volatilizes within the aforementioned temperature range is advantageous in that it minimizes deterioration of the wiring metal while facilitating adjustment of the dielectric property of the insulating film.

The composition for forming a silica based coating film of the invention also preferably contains no alkali metal or alkaline earth metal, or if it does, the concentration of these metal ions in the composition is preferably no greater than 100 ppb, and more preferably no greater than 20 ppb.

If the concentration of these metal ions exceeds 100 ppb, the metal ions will more easily flow into the semiconductor element bearing the silica based coating film obtained from the composition, possibly having an adverse effect on the function of the device itself. Thus, it may be necessary or effective to use an ion-exchange filter to remove the alkali metals or alkaline earth metals from the composition.

After applying the composition for forming a silica based coating film onto a wafer or other substrate in the manner described below, it is heated and fired for curing, thereby forming a silica based coating film which exhibits a low permittivity (Low-k film). Here, thermal decomposition or volatilization of component (d) results in gradual formation of fine pores (gaps or pores) in the film to allow uniformity of porosity and shape of the pores during the final curing.

Also, since the onium salt of component (c) is included as an essential component, it is possible to achieve improved mechanical strength and electrical reliability of the silica based coating film. Thus, delamination at the interface of the silica based coating film with other layers (films) can be prevented, for example, during CMP carried out in the subsequent steps. While certain detailed aspects of the functional mechanism by which this effect is exhibited is not yet understood, one reason is presumed to be that the onium salt promotes the dehydrating condensation reaction thereby increasing the density of siloxane bonds, and that the reduction in residual silanol groups improves the mechanical strength and dielectric properties.

Also, the combined effect of the annealing exhibited during the final heating, in addition to the pore-forming process and high densification of siloxane bonds, can potentially cause relaxation of stress of the entire film. However, the effect is not limited to that described above.

Furthermore, if the total number of bonded atoms in the siloxane resin is no greater than 0.65, it will be possible to achieve sufficient mechanical strength while ensuring adequate adhesion with other films (layers). Thus, interfacial delamination during the Cu-CMP step in which the excess Cu film produced upon lamination of the wiring metal is polished can be further prevented.

A method of forming a silica based coating film on a substrate using the composition for forming a silica based coating film according to the invention will now be explained using an example of an ordinary spin coating method for excellent film-forming properties and film uniformity of the silica based coating film. In this method, a liquid composition for forming a silica based coating film is applied onto a Si wafer or other substrate as a film, and the film is subjected to a precuring step and then to a final curing step to form a silica based coating film of the invention.

First, the composition for forming a silica based coating film is applied onto the Si wafer or other substrate by spin coating at preferably 500-5000 rpm and more preferably 1000-3000 rpm to form a coating. If the rotation rate is less than 500 rpm, the film uniformity will tend to be impaired, and if it is greater than 5000 rpm, the film-forming property will tend to be impaired.

The coating is then subjected to a precuring step. This step promotes drying of the solvent in the composition and increases the hardness of the siloxane resin, and involves heat treatment at a temperature of preferably 100-350° C., more preferably 150-300° C. and most preferably 150-250° C. (first heating temperature $T_1$). The precuring step may also be stepwise heating at different temperatures.

If the heating temperature $T_1$ is below 100° C., drying of the solvent will tend to be inadequate. On the other hand, if the heating temperature $T_1$ is above 350° C., the pore-forming thermal decomposing/volatilizing compound (component (d)) will thermally decompose and volatilize before the siloxane skeleton is formed in the coating, making it difficult to obtain a silica based coating film having the desired mechanical strength and low dielectric properties.

The heating time for the precuring step is preferably from 1 second to 1 hour, more preferably from 2 seconds to 10 minutes, even more preferably from 10 seconds to 5 minutes, and most preferably from 30 seconds to 3 minutes. If the heating time is less than 1 second, drying of the solvent will tend to be inadequate and curing of the resin will tend to proceed insufficiently. In contrast, a heating time of longer than 1 hour may result in lower throughput and will make it difficult to adequately minimize heat input.

When these considerations are weighed, the optimum conditions for the precuring step may be stepwise heating of, for example, 150° C./1 min+250° C./1 min, although it will depend on the thickness of the applied coating and the physical properties required for the silica based coating film.

Next, the coating which has been subjected to solvent removal and precuring is fired at a temperature of, for example, 350-500° C. (second heating temperature $T_2$) for final curing (final curing step). The temperature may be below 350° C., for example, about 300° C., but it will tend to be difficult to achieve adequate curing if it is below 300° C. Also, if the heating temperature is below 350° C., decomposition and volatilization of component (d) may not proceed sufficiently in some cases.

On the other hand, if the heating temperature exceeds 500° C., the heat input will be increased if a metal wiring layer is present, risking deterioration of the wiring metal. When considered from the standpoint of further reducing heat input to the Si wafer and carrying out sufficient curing within a short time, the temperature is preferably no higher than 400° C., more preferably no higher than 357° C. and more preferably about 350° C. The final curing is preferably carried out in an inert gas atmosphere of $N_2$, Ar, He or the like, in which case the oxygen concentration is preferably no greater than 1000 ppm.

The heating time is preferably 2-60 minutes, and more preferably 2-30 minutes. If the heating time is longer than 60 minutes, the heat input may be excessively increased, possibly leading to deterioration of the wiring metal. The heating apparatus used is preferably a heat treatment apparatus such as a quartz tube furnace or other furnace, a hot plate, rapid thermal annealing (RTA) or the like.

The film thickness of the silica based coating film in this manner is preferably 0.01-40 μm, and more preferably 0.1-2.0 μm. If the film thickness exceeds 40 μm it may be susceptible to cracking by stress, and if it is less than 0.01 μm, the leak property will tend to be poor between upper or lower wiring when a metal wiring layer is present above or below the silica based coating film.

According to the method for preparation of the silica based coating film of the invention, it is possible to obtain a silica based coating film having high elasticity with an elastic modulus of preferably 2.5 GPa or greater, more preferably 3.0 GPa or greater, even more preferably 3.5 GPa or greater and particularly preferably 4.0 GPa or greater. An elastic modulus of less than 2.5 GPa may result in inconveniences such as working difficulties when the silica based coating film is used as a semiconductor insulating film, for example.

The silica based coating film of the invention has (numerous) pores formed therein having a mean pore size of preferably no greater than 4.0 nm, more preferably no greater than 3.0 nm and most preferably no greater than 2.2 nm. If the mean pore size is greater than 4.0 nm, the CMP resistance may be insufficient depending on the film thickness. On the other hand, if the mean pore size is too small (for example, 0.1 nm or smaller), formation of the pores may be hampered, and it may be difficult to achieve the required low permittivity.

The pore size of maximum frequency is preferably no greater than 2.0 nm, and more preferably no greater than 1.5 nm, for even greater utility. If the pore size of maximum frequency is greater than 2.0 nm, it may be difficult to achieve adequate mechanical strength, depending on the film thickness.

In addition, it is preferred that there be substantially no pores in the silica based coating film having a size of 10 nm or greater (that the maximum value for the formed pore size be less than 10 nm). If pores with a size 10 nm or greater are present, despite the presence of even finer pores, generation and propagation of cracks originating from the large-sized pores, and thus film breakage, can occur when the film is exposed to unwanted force such as stress.

Second Embodiment

As a specific composition used as the composition for formation of a silica based coating film of the invention, there may be mentioned one comprising the following components (a) and (b), and component (e) described below, as essential components. This composition for forming a silica based coating film will now be explained.

<Component (a)>

The same component as described for [First embodiment].

<Component (b)>

Component (b) for this embodiment is a solvent capable of dissolving component (a), i.e. the aforementioned siloxane resin, and particularly it is a solvent composed of a first solvent component comprising an alkyleneglycol alkyl ether alkyl ester or alkyleneglycol alkyl ether acetate and a second solvent component comprising an alkyleneglycol monoalkyl ether.

The weight ratio of the first solvent component and second solvent is preferably 1:99 to 60:40, more preferably 5:95 to 50:50 and even more preferably 10:90 to 40:60. If the weight ratio is less than 1:99 (that is, if the weight ratio of first solvent/second solvent is less than 1/99), deterioration of the mechanical strength of the finally obtained silica based coating film will tend to be significant. On the other hand, if the weight ratio is greater than 60:40 (that is, if the weight ratio of first solvent/second solvent is greater than 60/40), deterioration of the physical properties such as film thickness uniformity of the silica based coating film will tend to be significant.

As examples for the first solvent component there may be mentioned ethyleneglycol methyl ether propionate, ethyleneglycol ethyl ether propionate, acetate ethyleneglycol methyl ether acetate, ethyleneglycol ethyl ether acetate, diethyleneglycol methyl ether acetate, diethyleneglycol ethyl ether acetate, diethyleneglycol-n-butyl ether acetate, propyleneglycol ethyl ether acetate, propyleneglycol propyl ether acetate, dipropyleneglycol methyl ether acetate and dipropyleneglycol ethyl ether acetate. Preferred among these, from the standpoint of mechanical strength of the silica based coating film obtained as the cured film, are alkyleneglycol methyl ether acetates and propyleneglycol alkyl ether acetates, among which propyleneglycol methyl ether acetate is particularly preferred.

As examples for the second solvent component there may be mentioned ethyleneglycol monomethyl ether, ethyleneglycol monoethyl ether, ethyleneglycol mono-n-hexyl ether, ethyleneglycol monophenyl ether, ethyleneglycol mono-2-ethylbutyl ether, propyleneglycol monomethyl ether, propyleneglycol monoethyl ether, propyleneglycol monopropyl ether, diethyleneglycol monoethyl ether, diethyleneglycol mono-n-butyl ether, diethyleneglycol mono-n-hexyl ether, dipropyleneglycol monomethyl ether and dipropyleneglycol monoethyl ether, among which propyleneglycol monopropyl ether is particularly preferred from the standpoint of increasing the film thickness uniformity of the silica based coating film.

The solvent as component (b) may also comprise other solvent components if necessary. Examples of such other solvent components include the various solvents which may be used as component (b), mentioned above. These may be used alone or in combinations of two or more for use with the first solvent and second solvent.

As mentioned above, the amount of component (b) used is preferably an amount such that the amount of component (a) (siloxane resin) is 3-25 wt %. If the amount of solvent is so little as to increase the concentration of component (a) above 25 wt %, the shapeability of the silica based coating film may be impaired, and the storage stability of the composition itself will tend to be lower. On the other hand, if the amount of solvent is so great as to decrease the concentration of component (a) below 3 wt %, it will tend to be difficult to form a silica based coating film to the desired thickness.

<Component (e)>

Component (e) is a polymer with a side chain containing a hydroxyl group, and it is a polymer wherein the hydroxyl group concentration $M_{OH}$ (mol/g) on the side chains satisfies the relationship represented by the following inequality (9):

$$0 < M_{OH} < 0.4 \times 10^{-2} \qquad (9).$$

If the hydroxyl group concentration $M_{OH}$ is 0 (zero) mol/g, i.e., when no hydroxyl groups are present on side chains, phase separation may occur between the siloxane resin of component (a) and the polymer when the solvent is removed from the composition by volatilization or the like. This will excessively increase the pore sizes of the finally obtained silica based coating film, while widening the size distribution tending to result in poor uniformity of the fine pores, and potentially leading to lower mechanical strength. On the other hand, if the hydroxyl group concentration $M_{OH}$ is greater than $0.4 \times 10^{-2}$ mol/g, decomposition or volatilization of the polymer during heating may be hampered, resulting in an inconvenience whereby higher temperature and longer time is required for the heat treatment.

The hydroxyl group concentration ($M_{OH}$) (mol/g) may be determined from the charged volume of the polymer, and for example, it may be calculated according to the relationship represented by the following formula (10):

$$M_{OH} = (Ma \times Mb/Mb)/Mh \times 100 \qquad (10).$$

In this formula, Ma represents the molar ratio of the smallest repeating unit containing a hydroxyl group, Mb represents the molecular weight of hydroxyl groups (OH groups), and Mh represents the average molecular weight of the polymer.

The polymer used as component (e) has a reduction rate of preferably 95 wt % or greater, more preferably 97 wt % or greater and more preferably 99 wt % or greater, in a nitrogen gas atmosphere at a temperature of 300-500° C. If the reduction rate is less than 95 wt %, decomposition or volatilization of the polymer upon heating of the composition will tend to be insufficient, and the polymer, portions of the polymer or reaction products from the polymer may remain in the finally obtained silica based coating film. This can lead to deterioration of the electrical properties of the silica based coating film, including increased specific permittivity.

The "reduction rate" of the polymer as component (e) according to the invention is the value determined by the following apparatus under the following conditions.

Apparatus used: TG/DTA6300 (Seiko Instruments)
Initial temperature: 50° C.
Temperature-elevating rate: 10° C./minute
Sample weight: 10 mg
Atmosphere: Nitrogen ($N_2$) gas, 200 ml/min
Reference: α-alumina (Seiko Instruments)
Sample container: Open sample pan, φ5, aluminum (Seiko Instruments)

The basis weight of the polymer of component (e) before decomposition begins is the weight at 150° C. during temperature increase. This is presumably because weight reduction at below 150° C. is due to removal of adsorbed moisture and the like, with substantially no decomposition of the polymer (component (e)) itself.

Since the polymer as component (e) is dissolved in the solution during measurement of the "reduction rate", in cases where the weight of the polymer alone cannot be directly measured, approximately 2 g of the solution containing the polymer is measured into a metal dish, for example, and dried for 3 hours at 150° C. in air at ordinary pressure, and the obtained residue is used as the sample.

From the standpoint of compatibility with the siloxane resin of component (a), the polymer of component (e) has a weight-average molecular weight of preferably 500-100,000 and more preferably 1,000-50,000, as measured by GPC and calculated using a standard polystyrene calibration curve. If the weight-average molecular weight is less than 500, the shapeability of the silica based coating film will tend to be inferior. On the other hand, if the weight-average molecular weight is greater than 100,000, the compatibility with the siloxane resin will tend to be lower.

As specific examples of hydroxyl group-containing compounds (monomer components) for the polymer of component (e), there may be mentioned (meth)acrylic acid derivatives such as acrylic acid, 2-hydroxyethyl acrylate, diethyleneglycol acrylate, 2-hydroxypropyl acrylate, dipropyleneglycol acrylate, methacrylic acid, 2-hydroxyethyl methacrylate, diethyleneglycol methacrylate, 2-hydroxypropyl methacrylate and dipropyleneglycol methacrylate, as well as vinyl alcohol, allyl alcohol, and the like.

The polymer of component (e) may also contain a compound with no hydroxyl groups as a constituent component thereof, for the purpose of adjusting the hydroxyl group concentration $M_{OH}$ on the side chains.

As examples of such compounds with no hydroxyl groups there may be mentioned vinyl ether-based compounds, vinyl-based compounds having a polyethylene oxide structure, vinyl-based compounds having a polypropylene oxide structure, vinylpyridine-based compounds, styrene-based compounds, alkyl ester vinyl-based compounds, and (meth) acrylic acid-based compounds. Among these there are preferred compounds having ester bonds, from the standpoint of achieving excellent decomposition and volatilization properties of the polymer, and there are particularly preferred (meth)acrylic acid-based compounds ((meth)acrylic acid derivatives) such as mentioned in the explanation for component (d) above.

As (meth)acrylic acid derivatives there may be mentioned acrylic acid esters and methacrylic acid esters such as acrylic acid alkyl esters, methacrylic acid alkyl esters, acrylic acid alkoxyalkyl esters, methacrylic acid alkyl esters and methacrylic acid alkoxyalkyl esters.

As acrylic acid alkyl esters there may be mentioned C1-6 alkyl esters such as methyl acrylate, ethyl acrylate, n-propyl acrylate, isopropyl acrylate, n-butyl acrylate, isobutyl acrylate, pentyl acrylate and hexyl acrylate, and as methacrylic acid alkyl esters there may be mentioned C1-6 alkyl esters such as methyl methacrylate, ethyl methacrylate, n-propyl methacrylate, isopropyl methacrylate, n-butyl methacrylate, isobutyl methacrylate, pentyl methacrylate and hexyl methacrylate.

As acrylic acid alkoxyalkyl esters there may be mentioned methoxymethyl acrylate and ethoxyethyl acrylate, and as methacrylic acid alkoxyalkyl esters there may be mentioned methoxymethyl methacrylate and ethoxyethyl methacrylate.

The composition for forming a silica based coating film according to this "second embodiment" (comprising component (a), component (b) and component (e) as essential components), like that of the "first embodiment", preferably contains no alkali metal or alkaline earth metal, or if it does, the concentration of these metal ions in the composition is preferably no greater than 100 ppb, and more preferably no greater than 20 ppb.

If the concentration of these metal ions exceeds 100 ppb, the metal ions will more easily flow into the semiconductor element bearing the silica based coating film obtained from the composition, possibly having an adverse effect on the performance of the device itself. Thus, it may be necessary or effective to use an ion-exchange filter to remove the alkali metals or alkaline earth metals from the composition.

The composition for forming of a silica based coating film according to this embodiment, like that of the "first embodiment", is applied onto a wafer or other substrate in the manner described below, and is then heated and fired for curing, thereby forming a silica based coating film which exhibits a low permittivity (Low-k film). Here, since the composition comprises the first solvent component and second solvent component as the solvent of component (b), the mechanical strength of the silica based coating film is adequately increased while the film thickness uniformity is improved.

In addition, the existence of hydroxyl groups on the side chains of the polymer as the essential component (e) prevents phase separation between the siloxane resin of component (a) and the polymer during removal of the solvent of component (b) by volatilization or the like, to allow formation of finer pores inside the film and achieve a more uniform shape. Consequently, reduction in the mechanical strength of the finally obtained silica based coating film can be further inhibited.

Also, since the onium salt of component (c) is included as an essential component, it is possible to achieve improved mechanical strength and electrical reliability of the silica based coating film. Thus, delamination at the interface of the silica based coating film with other layers (films) can be prevented, for example, during the CMP step.

While certain detailed aspects of the functional mechanism by which this effect is exhibited is not yet understood, one reason is presumed to be that the onium salt promotes the dehydrating condensation reaction thereby increasing the density of siloxane bonds, and that the reduction in residual silanol groups improves the mechanical strength and dielectric properties. However, the effect is not limited to that described above.

A total number of bonded atoms in the siloxane resin of no greater than 0.65 will allow adequate mechanical strength to be realized, while ensuring sufficient adhesion with other films (layers). This will further prevent interfacial delamination during the step of CMP (Chemical Mechanical Polishing) of wiring metals such as Cu covering the silica based coating film.

In addition, since the concentration of hydroxyl groups on the side chains of the polymer as component (e) is within the upper limit mentioned above, decomposition of component (e) during heating is minimized, while its volatilization is promoted. Consequently, it is possible to accomplish curing of the composition at lower temperature and in a shorter time than according to the prior art. As a result, heat input to the substrate can be vastly reduced, thereby inhibiting deterioration of other films (layers) and thus the device properties, while also improving throughput by shortening of the process time.

A method of forming a silica based coating film on a substrate using the composition for forming a silica based coating film according to the invention will now be explained using a spin coating method as an example, as described above.

First, the composition for forming a silica based coating film is applied onto the silicon wafer or other substrate by spin coating at preferably 500-5000 rpm and more preferably 1000-3000 rpm to form a coating. If the rotation rate is less than 500 rpm, the film uniformity will tend to be impaired, and if it is greater than 5000 rpm, the film-forming property will tend to be impaired.

Next, the solvent in the coating is dried with a hot plate or the like at preferably 50-350° C. and more preferably 100-250° C. If the drying temperature is below 50° C., drying of the solvent will tend to be inadequate. On the other hand, if the drying temperature is above 350° C., the pore-forming polymer (component (e)) will thermally decompose before the siloxane skeleton is formed in the coating, thereby undesirably increasing the degree of volatilization, and potentially making it difficult to obtain a silica based coating film having the desired mechanical strength and low dielectric properties.

The solvent-removed coating is then fired at a heating temperature of 250-500° C. for final curing. The final curing is preferably carried out in an inert gas atmosphere of $N_2$, Ar, He or the like, in which case the oxygen concentration is preferably no greater than 1000 ppm. If the heating temperature is below 250° C., sufficient curing may not be achieved, and decomposition and volatilization of component (e) may not proceed adequately. On the other hand, if the heating temperature is above 500° C., increased heat input will tend to result in deterioration of the wiring metal in cases where a wiring metal layer is present.

As in the final curing step described above, the heating time is preferably 2-60 minutes, and more preferably 2-30 minutes. If the heating time is longer than 60 minutes, the heat input may be excessively increased, possibly leading to deterioration of the wiring metal. The heating apparatus used is preferably a heat treatment apparatus such as a quartz tube furnace or other furnace, a hot plate, rapid thermal annealing (RTA) or the like.

Also as explained above, the film thickness of the silica based coating film formed in this manner is preferably 0.01-40 µm, and more preferably 0.1-2.0 µm. If the film thickness exceeds 40 µm it may be susceptible to cracking by stress, and if it is less than 0.01 µm, the leak property will tend to be poor between upper or lower wiring when a metal wiring layer is present above or below the silica based coating film.

[Electronic Parts]

As electronic parts comprising silica based coating films formed using the composition for forming a silica based coating film according to the invention, there may be mentioned devices having insulating films, such as semiconductor elements, multilayer wiring boards, and the like.

Specifically, for a semiconductor element, the silica based coating film may be used as a surface protective film (passivation film), buffer coat film, interlaminar insulating film or the like. For a multilayer wiring board, it may be suitably used as an interlaminar insulating film.

More specifically, as semiconductor elements there may be mentioned discrete semiconductors such as diodes, transistors, compound semiconductors, thermistors, varistors, thyristors and the like, memory elements such as DRAM (dynamic random access memory), SRAM (static random access memory), EPROM (erasable programmable read only memory), mask ROM (mask read only memory), EEPROM (electrical erasable programmable read only memory), flash memory and the like, logic circuit elements such as microprocessors, DSP, ASIC and the like, integrated circuit elements including compound semiconductors such as MMIC (monolithic microwave integrated circuit), hybrid integrated circuits (hybrid ICs), and photoelectric conversion elements such as light emitting diodes, charge-coupled elements and the like. As multilayer wiring boards there may be mentioned high-density wiring boards such as MCMs and the like.

Such electronic parts can be provided with a silica based coating film of the invention exhibiting low permittivity, in order to achieve high performance including reduced signal propagation delay time, as well as high reliability.

EXAMPLES

The present invention will now be explained in greater detail through the following examples, with the understanding that these examples are in no way limitative on the invention.

Synthesis Example 1-1

A thermal decomposing/volatilizing compound was synthesized as component (d) by the following procedure. First, 300 g of propyleneglycol monomethyl ether acetate (PGMEA) was charged into a 1000 ml flask, 100 g of methyl methacrylate dissolving 2.0 g of azobisisobutyronitrile (AIBN) was charged into a 200 ml dropping funnel, the system was substituted with nitrogen gas, and then the mixture was heated and stirred in a 130° C. oil bath under a nitrogen gas atmosphere while the solution in the dropping funnel was added dropwise into the flask over a period of 2 hours.

After then stirring for 30 minutes, 97.8 g of PGMEA dissolving 0.2 g of AIBN was charged into the dropping funnel and added dropwise into the flask over a period of 1 hour. After the dropwise addition, stirring was continued for another 2 hours and the mixture was returned to room temperature to obtain a thermal decomposing/volatilizing compound as component (d), in solution form.

The weight-average molecular weight as measured by GPC was 12,800. Also, 2 g of the solution was measured into a metal dish and dried for 3 hours with a drier at 150° C. to determine the concentration of the decomposing/volatilizing compound as 18.5 wt %.

Synthesis Example 1-2

To a solution of 116.7 g of tetraethoxysilane and 78.5 g of methyltriethoxysilane in 339.8 g of propyleneglycol monopropyl ether (PGP) there was added dropwise 64.2 g of water dissolving 0.92 g of 70% nitric acid, while stirring over a period of 30 minutes. After completion of the dropwise addition, reaction was conducted for 5 hours to obtain a polysiloxane solution.

Example 1-1

After placing 200 g of the polysiloxane solution obtained in Synthesis Example 1-2 and 48.7 g of the liquid decomposing/volatilizing compound obtained in Synthesis Example 1-1 in a 300 ml round-bottomed flask, the mixture was stirred for 2 hours. Next, the produced ethanol and low-boiling-point substances were distilled off in a warm bath under reduced pressure using a rotary evaporator, to obtain 180.0 g of a liquid polysiloxane/decomposing/volatilizing compound. Next, 13.5 g of a 2.4% tetramethylammonium nitrate aqueous solution was added to the solution to prepare a composition for forming a silica based coating film according to the invention.

Synthesis Example 1-3

A thermal decomposing/volatilizing compound was synthesized as component (d) by the following procedure. First, 300 g of PGMEA was charged into a 1000 ml flask, 95 g of methyl methacrylate and 5 g of 2-hydroxyethyl methacrylate dissolving 2.0 g of AIBN were charged into a 200 ml dropping funnel, the system was substituted with nitrogen gas, and then the mixture was heated and stirred in a 130° C. oil bath under a nitrogen gas atmosphere while the solution in the dropping funnel was added dropwise into the flask over a period of 2 hours.

After then stirring for 30 minutes, 97.8 g of PGMEA dissolving 0.2 g of AIBN was charged into the dropping funnel and added dropwise into the flask over a period of 1 hour. After the dropwise addition, stirring was continued for another 2 hours and the mixture was returned to room temperature to obtain a thermal decomposing/volatilizing compound as component (d), in solution form.

The weight-average molecular weight as measured by GPC was 10,700. Also, 2 g of the solution was measured into a metal dish and dried for 3 hours with a drier at 150° C. to determine the concentration of the decomposing/volatilizing compound as 16.8 wt %.

Example 1-2

After placing 200 g of the polysiloxane solution obtained in Synthesis Example 1-2 and 47.5 g of the liquid decomposing/volatilizing compound obtained in Synthesis Example 1-3 in a 300 ml round-bottomed flask, the mixture was stirred for 2 hours. Next, the produced ethanol and low-boiling-point substances were distilled off in a warm bath under reduced pressure using a rotary evaporator, to obtain 180.0 g of a liquid polysiloxane/decomposing/volatilizing compound. Next, 13.5 g of a 2.4% tetramethylammonium nitrate aqueous solution was added to the solution to prepare a composition for forming a silica based coating film according to the invention.

Comparative Example 1-1

After placing 200 g of the polysiloxane solution obtained in Synthesis Example 1-2 and 48.7 g of the liquid decomposing/volatilizing compound obtained in Synthesis Example 1-1 in a 300 ml round-bottomed flask, the mixture was stirred for 2 hours. Next, the produced ethanol and low-boiling-point substances were distilled off in a warm bath under reduced pressure using a rotary evaporator, to obtain 180.0 g of a liquid polysiloxane/decomposing/volatilizing compound, in order to prepare a composition for forming a silica based coating film.

Stress Evaluation 1

(1) Silica Based Coating Film Formation and Film Thickness Measurement

Each of the compositions for forming a silica based coating film obtained in Examples 1-1 and 1-2 and Comparative Example 1-1 was spin coated onto a plurality of Si wafers at 1250 rpm/30 seconds to form coatings. After the spin coating, each Si wafer was subjected to heat treatment at 150° C./3 min, to remove the solvent in the coating to form a silica based coating film.

The film thickness of the coating was measured using an ellipsometer (L116B Ellipsometer, use wavelength: 633 nm, product of Gardner). Specifically, it was measured by irradiating the interlaminar insulating film with He—Ne laser light, and determining the thickness from the phase difference produced by irradiation at the indicated wavelength. Next, the degree of "warping" of the Si wafer was measured according to the method and procedure described under [Stress evaluation method] above.

After measurement of the film thickness and degree of "warping", the Si wafer was heat treated at 400° C./30 min in a quartz tube furnace with the $O_2$ concentration controlled to about 100 ppm, for final curing of the silica based coating film. The film thickness and degree of "warping" of the coating were measured in the same manner as described above.

(2) Stress Evaluation

The displacement of the "warping", the measured film thickness, and the other parameters were substituted into formula (4) to calculate the stress of each silica based coating film. The results are shown together with the film thicknesses in Table 1-1.

Specific Permittivity Measurement 1

The specific permittivity of the silica based coating film formed in <Stress evaluation 1> above was measured according to the [Specific permittivity measurement method] described above. The results are listed in Table 1-1.

Elastic Modulus Measurement 1

The elastic modulus of the silica based coating film formed in <Stress evaluation 1> above was measured according to the [Elastic modulus measurement method] described above. The results are listed in Table 1-1.

TABLE 1-1

|   | Example 1-1 | Example 1-1 | Comparative Example 1-1 |
|---|---|---|---|
| Film thickness (μm) | 0.530 | 0.650 | 0.540 |
| Elastic modulus (GPa) | 3.8 | 4.0 | 3.2 |
| Specific permittivity (-) | 2.6 | 2.3 | 2.8 |
| Stress in precuring (MPa) | 13 | 18 | <5 |

Pore Distribution Measurement 1

The pore distributions of the silica based coating film formed in Example 1-2 and a silica based coating film formed using a conventional composition (prior art product) were measured by X-ray diffuse scattering analysis using an ATX-G X-ray diffraction apparatus by Rigaku Corp. as the measuring instrument. FIG. 1 is a graph showing the pore distributions (standardized by pore size), wherein curves L1 and L2 represent smoothed frequency distributions obtained for the silica based coating films of Example 1-2 and the prior art product. The results for the mean pore size and pore size of maximum frequency obtained from the pore distributions are shown in Table 1-2.

TABLE 1-2

|   | Example 1-2 | Prior art product |
|---|---|---|
| Mean pore size (nm) | 2.0 | 5.1 |
| Pore size of maximum frequency (nm) | 1.3 | 3.5 |

Synthesis Example 2-1

A thermal decomposing/volatilizing compound was synthesized as component (d) by the following procedure. First, 300 g of propyleneglycol monomethyl ether acetate (PGMEA) was charged into a 1000 ml flask, 95 g of methyl methacrylate and 5 g of 2-hydroxyethyl methacrylate dissolving 2.0 g of azobisisobutyronitrile (AIBN) were charged into a 200 ml dropping funnel, the system was substituted with nitrogen gas, and then the mixture was heated and stirred in a 130° C. oil bath under a nitrogen gas atmosphere while the solution in the dropping funnel was added dropwise into the flask over a period of 2 hours.

After then stirring for 30 minutes, 97.8 g of PGMEA dissolving 0.2 g of AIBN was charged into the dropping funnel and added dropwise into the flask over a period of 1 hour. After the dropwise addition, stirring was continued for another 2 hours and the mixture was returned to room temperature to obtain a thermal decomposing/volatilizing compound as component (d), in solution form.

The weight-average molecular weight as measured by GPC was 10,700. Also, 2 g of the solution was measured into a metal dish and dried for 3 hours with a drier at 150° C. to determine the concentration of the decomposing/volatilizing compound as 16.8 wt %.

Synthesis Example 2-2

To a solution of 116.7 g of tetraethoxysilane and 78.5 g of methyltriethoxysilane in 339.8 g of propyleneglycol monopropyl ether (PGP) there was added dropwise 64.2 g of water dissolving 0.92 g of 70% nitric acid, while stirring over a period of 30 minutes. After completion of the dropwise addition, reaction was conducted for 5 hours to obtain a polysiloxane solution.

Example 2-1

After placing 200 g of the polysiloxane solution obtained in Synthesis Example 2-2 and 47.5 g of the liquid decomposing/volatilizing compound obtained in Synthesis Example 2-1 in a 300 ml round-bottomed flask, the mixture was stirred for 2 hours. Next, the produced ethanol and low-boiling-point substances were distilled off in a warm bath under reduced pressure using a rotary evaporator, to obtain 180.0 g of a liquid polysiloxane/decomposing/volatilizing compound. Next, 13.5 g of a 2.4% tetramethylammonium nitrate aqueous solution was added to the solution to prepare a composition for forming a silica based coating film according to the invention.

Stress Evaluation 2

(1) Silica Based Coating Film Formation and Film Thickness Measurement

The composition for forming a silica based coating film obtained in Example 1 was spin coated onto a plurality of Si wafers at 1390 rpm/30 seconds to form coatings. After the spin coating, each Si wafer was subjected to heat treatment at 150° C./1 min+250° C./1 min (precuring treatment at first heating temperature), to remove the solvent in the coating to form a silica based coating film.

The film thickness of the coating was measured using an ellipsometer (L116B Ellipsometer, use wavelength: 633 nm, product of Gardner). Specifically, it was measured by irradiating the interlaminar insulating film with He—Ne laser light, and determining the thickness from the phase difference produced by irradiation at the indicated wavelength. Next, the degree of "warping" of the Si wafer was measured according to the method and procedure described under [Stress evaluation method] above.

After measurement of the film thickness and degree of "warping", the Si wafer was heat treated at 400° C./30 min in a quartz tube furnace with the $O_2$ concentration controlled to about 100 ppm, for final curing of the silica based coating film (final curing step at second heating temperature). The film thickness and degree of "warping" of the coating were measured in the same manner as described above.

(2) Stress Evaluation

The displacement of the "warping", the measured film thickness, and the other parameters were substituted into formula (3) to calculate the stress of the silica based coating film for precuring at the first heating temperature (first stress), and the stress of the silica based coating film for final curing at the second heating temperature (second stress). The results are shown together with the film thicknesses in Table 2-1.

Specific Permittivity Measurement 2

The specific permittivity of the silica based coating film formed in <Stress evaluation 2> above was measured according to the [Specific permittivity measurement method] described above. The results are listed in Table 2-1.

Elastic Modulus Measurement 2

The elastic modulus of the silica based coating film formed in <Stress evaluation 2> above was measured according to the [Elastic modulus measurement method] described above. The results are listed in Table 2-1.

TABLE 2-1

|  | Example 2-1 |
| --- | --- |
| Film thickness (μm) | 0.559 |
| Elastic modulus (GPa) | 5.4 |
| Specific permittivity (-) | 2.4 |
| First stress in precuring (MPa) | 64 |
| Second stress in final curing (MPa) | 39 |

Synthesis Example 3-1

A thermal decomposing/volatilizing compound was synthesized as component (d) by the following procedure. First, 300 g of PGMEA was charged into a 1000 ml flask, 95 g of methyl methacrylate and 5 g of 2-hydroxyethyl methacrylate dissolving 2.0 g of AIBN were charged into a 200 ml dropping funnel, the system was substituted with nitrogen gas, and then the mixture was heated and stirred in a 130° C. oil bath under a nitrogen gas atmosphere while the solution in the dropping funnel was added dropwise into the flask over a period of 2 hours.

After then stirring for 30 minutes, 97.8 g of PGMEA dissolving 0.2 g of AIBN was charged into the dropping funnel and added dropwise into the flask over a period of 1 hour. After the dropwise addition, stirring was continued for another 2 hours and the mixture was returned to room temperature to obtain a thermal decomposing/volatilizing compound as component (d), in solution form.

The weight-average molecular weight as measured by GPC was 10,700. Also, 2 g of the solution was measured into a metal dish and dried for 3 hours with a drier at 150° C. to determine the concentration of the decomposing/volatilizing compound as 16.8 wt %.

Synthesis Example 3-2

To a solution of 132.3 g of tetraethoxysilane and 65.1 g of methyltriethoxysilane in 339.8 g of propyleneglycol monopropyl ether (PGP) there was added dropwise 65.8 g of water dissolving 0.92 g of 70% nitric acid, while stirring over a period of 30 minutes. After completion of the dropwise addition, reaction was conducted for 5 hours to obtain a polysiloxane solution.

Example 3-1

After placing 200 g of the polysiloxane solution obtained in Synthesis Example 3-2 and 53.2 g of the liquid decomposing/volatilizing compound obtained in Synthesis Example 3-1 in a 300 ml round-bottomed flask, the mixture was stirred for 2 hours. Next, the produced ethanol and low-boiling-point substances were distilled off in a warm bath under reduced pressure using a rotary evaporator, to obtain 180.0 g of a liquid polysiloxane/decomposing/volatilizing compound. Next, 13.5 g of a 2.4% tetramethylammonium nitrate aqueous solution was added to the solution to prepare a composition for forming a silica based coating film according to the invention.

Comparative Example 3-1

After placing 200 g of the polysiloxane solution obtained in Synthesis Example 3-2 and 44.7 g of a 20 wt % PGP solution of polyethyleneglycol monooleyl ether (n≈7, product of Tokyo Kasei) in a 300 ml round-bottomed flask, the mixture was stirred for 2 hours. Next, the produced ethanol and low-boiling-point substances were distilled off in a warm bath under reduced pressure using a rotary evaporator, to obtain 180.0 g of a liquid polysiloxane/decomposing/volatilizing compound. Next, 13.5 g of a 2.4% tetramethylammonium nitrate aqueous solution was added to the solution to prepare a composition for formation of a silica based coating film.

Interlaminar Insulating Film Production 1

The compositions for forming a silica based coating film obtained in Example 3-1 and Comparative Example 3-1 were each spin coated onto a plurality of Si wafers at 1500 rpm/30 seconds to form coatings. After the spin coating, each Si wafer was subjected to heat treatment at 150° C./1 min+250° C./1 min, to remove the solvent in the coating to form a silica based coating film. This was followed by heat treatment at 400° C./30 min in a quartz tube furnace with the $O_2$ concentration controlled to about 100 ppm, for final curing of the silica based coating film as an interlaminar insulating film.

Interlaminar Insulating Film Evaluation 1

The film thickness, specific permittivity, elastic modulus, adhesion and film strength of each obtained interlaminar insulating film were evaluated by the methods described below. The results are summarized in Table 3-1.

[Film Thickness Measurement]

The film thickness of each interlaminar insulating film was measured using an ellipsometer (L116B Ellipsometer, use wavelength: 633 nm, product of Gardner). Specifically, it was measured by irradiating the interlaminar insulating film with He—Ne laser light, and determining the thickness from the phase difference produced by irradiation at the indicated wavelength.

[Specific Permittivity Measurement]

This was measured according to the [Specific permittivity measurement method] described above.

[Elastic Modulus Measurement]

This was measured according to the [Elastic modulus measurement method] described above.

[Adhesion Evaluation]

The $K_1$ parameter was determined according to the [Modified-Edge Lift-OFF TEST (m-ELT) method] described above, as an index of the adhesion.

[Single Film CMP Resistance]

Each interlaminar insulating film was subjected to CMP polishing under conditions assumed to avoid polishing of the interlaminar laminating film. Specifically, a 2-cm square piece was cut out from the Si wafer, and HS-C430 by Hitachi Chemical Co., Ltd. was used as a slurry for one minute of polishing with an applied load of 400 gf/cm², upon which the presence of residual insulating film was determined.

Residue of the insulating film is judged as indicating sufficient film strength, and in Table 1, "o" indicates that absolutely no problem was encountered, while "x" indicates clumping or destruction of the insulating film.

TABLE 3-1

|  | Example 3-1 | Comparative Example 3-1 |
|---|---|---|
| Film thickness (μm) | 0.545 | 0.560 |
| Elastic modulus (GPa) | 5.0 | 4.5 |
| Specific permittivity (-) | 2.4 | 2.7 |
| $K_1$ value in m-ELT | 0.31 | <0.1 |
| Single film CMP resistance | o | x |

Synthesis Example 4-1

A polymer was synthesized as component (e) by the following procedure. First, 300 g of propyleneglycol monomethyl ether acetate (PGMEA) was charged into a 1000 ml flask, 95 g of methyl methacrylate and 5 g of 2-hydroxyethyl methacrylate dissolving 2.0 g of azobisisobutyronitrile (AIBN) were charged into a 200 ml dropping funnel, the system was substituted with nitrogen gas, and then the mixture was heated and stirred in a 130° C. oil bath under a nitrogen gas atmosphere while the solution in the dropping funnel was added dropwise into the flask over a period of 2 hours.

After then stirring for 30 minutes, 97.8 g of PGMEA dissolving 0.2 g of AIBN was charged into the dropping funnel and added dropwise into the flask over a period of 1 hour. After the dropwise addition, stirring was continued for another 2 hours and the mixture was returned to room temperature to obtain a polymer solution.

The hydroxyl group concentration $M_{OH}$ on the side chains, as calculated by the aforementioned formula (10), based on the charged amounts, was $0.038 \times 10^{-2}$ mol/g. The weight-average molecular weight measured according to GPC was 9,950. Also, 2 g of the polymer solution was measured into a metal dish and dried for 3 hours with a drier at 150° C. to determine the concentration of the polymer as 16.7 wt %. The weight reduction was 99% at 500° C., as measured using the dry polymer.

Example 4-1

To a solution of 132.3 g of tetraethoxysilane and 65.1 g of methyltriethoxysilane in 335.94 g of propyleneglycol monopropyl ether (PGP) there was added dropwise 65.8 g of water dissolving 0.92 g of 70% nitric acid, while stirring over a period of 30 minutes. After completion of the dropwise addition, reaction was conducted for 5 hours to obtain a polysiloxane solution.

To this solution there was added 229.6 g of the polymer solution obtained in Synthesis Example 1, and the produced ethanol was distilled off in a warm bath under reduced pressure to obtain a polysiloxane/polymer solution having a weight ratio of PGMEA and PGP (PGMEA:PGP ratio) of 36:64. Next, 26.47 g of a 2.38% tetramethylammonium nitrate aqueous solution (pH 3.6) was added to the polysiloxane/polymer solution to prepare a composition for forming a silica based coating film according to the invention.

Synthesis Example 4-2

A polymer was synthesized as component (e) by the following procedure. First, 300 g of PGP was charged into a 1000 ml flask, 45 g of methyl methacrylate and 55 g of 2-hydroxyethyl methacrylate dissolving 1.7 g of AIBN were charged into a 200 ml dropping funnel, the system was substituted with nitrogen gas, and then the mixture was heated and stirred in a 130° C. oil bath under a nitrogen gas atmosphere while the solution in the dropping funnel was added dropwise into the flask over a period of 2 hours.

After then stirring for 30 minutes, 97.8 g of PGP dissolving 0.17 g of AIBN was charged into the dropping funnel and added dropwise into the flask over a period of 1 hour. After the dropwise addition, stirring was continued for another 2 hours and the mixture was returned to room temperature to obtain a polymer solution.

The hydroxyl group concentration $M_{OH}$ on the side chains, as calculated by the aforementioned formula (10), based on the charged amounts, was 0.48 mol/g. The weight-average molecular weight measured according to GPC was 10,700. Also, 2 g of the polymer solution was measured into a metal dish and dried for 3 hours with a drier at 150° C. to determine the concentration of the polymer as 15.0 wt %. The weight reduction was 95% at 500° C., as measured using the dry polymer.

Comparative Example 4-1

After placing 255.6 g of the polymer solution obtained in Synthesis Example 4-2 in a polysiloxane solution prepared in the same manner as Example 4-1, the produced ethanol and low-boiling-point substances were distilled off in a warm bath under reduced pressure, to obtain 650 g of a polysiloxane/polymer solution, in order to prepare a composition for forming a silica based coating film.

Interlaminar Insulating Film Production 2

The compositions for forming a silica based coating film obtained in Example 4-1 and Comparative Example 4-1 were each spin coated onto a Si wafer at 1500 rpm/30 seconds to form coatings. After the spin coating, heat treatment was carried out at 150° C./1 min+250° C./1 min to remove the solvent in the coating, and this was followed by final curing of the coating at 400° C./30 min in a quartz tube furnace with the $O_2$ concentration controlled to about 100 ppm, to produce a silica based coating film as an interlaminar insulating film.

Interlaminar Insulating Film Evaluation 2

The film thickness, electrical properties and film strength of each obtained interlaminar insulating film were evaluated by the methods described below.

[Film Thickness Measurement]

The film thickness of each interlaminar insulating film was measured in the same manner as <Interlaminar insulating film evaluation 1>.

[Specific Permittivity Measurement]

This was measured according to the [Specific permittivity measurement method] described above.

[Elastic Modulus Measurement]

This was measured according to the [Elastic modulus measurement method] described above. The measurement results are summarized in Table 4-1.

TABLE 4-1

| | Example 4-1 | Comparative Example 4-1 |
|---|---|---|
| Film thickness (μm) | 0.550 | 0.580 |
| Film thickness uniformity (difference between maximum and minimum values (μm)) | <0.005 | <0.01 |
| Film condition (visual observation) | No coating irregularities | No coating irregularities |
| Hydroxyl group concentration of polymer (mol/g) | $0.038 \times 10^{-2}$ | 0.48 |
| Elastic modulus (GPa) | 4.8 | 3.0 |
| Specific permittivity (-) | 2.2 | 2.6 |

As explained above, the composition for forming a silica based coating film, the silica based coating film and the method for its preparation according to the invention allows formation of a silica based coating film having excellent low permittivity and sufficient mechanical strength, while achieving excellent film thickness uniformity and increasing adhesion with other films (layers), in order to improve the CMP resistance and prevent interfacial delamination. In addition, the curing proceeds in a lower temperature range than according to the prior art, so that heat input to the substrate on which the silica based coating film is formed can be reduced. It is thereby possible to prevent impairment in the function of wiring, etc. in the underlying layer.

Moreover, since curing proceeds in a low temperature range, the high temperature heat treatment for the final curing can be carried out in a shorter time, thereby allowing the heat history to be improved. In addition, since stress of the film can be reduced during the final curing, it is possible to prevent rapid stress increase in the coating. It is thereby possible to prevent impairment in the function of wiring, etc. in the underlying layer.

Also, electronic parts according to the invention having the silica based coating film can improve the electrical reliability of the device as a whole, while allowing increased productivity and process tolerance. It is also possible to provide electronic parts with high density and excellent quality and reliability, due to the superior properties of the silica based coating film.

What is claimed is:

1. A composition for forming silica based coating film which comprises
   component (a): siloxane resin obtained by hydrolytic condensation of a compound represented by the following formula (1):

$$R^1_n SiX_{4-n} \quad (1)$$

(wherein $R^1$ represents an H atom or F atom, a group containing a B atom, N atom, Al atom, P atom, Si atom, Ge atom or Ti atom, or a C1-20 organic group, X represents a hydrolyzable group, and n represents an integer of 0-2, with the proviso that when n is 2, each $R^1$ may be the same or different, and when n is 0-2, each X may be the same or different),
   component (b): a solvent capable of dissolving said component (a),
   component (c): an onium salt, and
   component (e): a polymer with a side chain containing a hydroxyl group,
   wherein said polymer satisfies the relationship represented by the following inequality (2):

$$0 < M_{OH} < 0.4 \times 10^{-2} \quad (2),$$

(wherein $M_{OH}$ represents the concentration (mol/g) of said hydroxyl groups in said polymer).

2. A composition for forming silica based coating film according to claim 1,
   wherein said component (b) is composed of a first solvent component comprising an alkyleneglycol alkyl ether alkyl ester or alkyleneglycol alkyl ether acetate and a second solvent component comprising an alkyleneglycol monoalkyl ether.

3. A composition for forming silica based coating film according to claim 2,
   wherein the mass fraction of said first solvent component and said second solvent component in said component (b) is 1:99-60:40.

4. A composition for forming silica based coating film according to claim 2,
   wherein said first solvent component is an alkyleneglycol methyl ether acetate.

5. A composition for forming silica based coating film according to claim 2,
   wherein said first solvent component is a propyleneglycol alkyl ether acetate.

6. A composition for forming silica based coating film according to claim 2,
   wherein said first solvent component is propyleneglycol methyl ether acetate.

7. A composition for forming silica based coating film according to claim 2, wherein said second solvent component is propyleneglycol monopropyl ether.

8. A composition for forming silica based coating film according to claim 1,
wherein the reduction percentage of said component (e) in a nitrogen gas atmosphere at a temperature of 300-500° C. is 95 wt % or greater.

9. A composition for forming silica based coating film according to claim 1,
wherein said component (e) contains an ester bond in the molecule.

10. A composition for forming silica based coating film according to claim 1,
wherein said component (e) comprises a (meth)acrylic acid derivative as a constituent component, with the content of said (meth)acrylic acid derivative at $0.5 \times 10^{-2}$ (mol/g) or greater.

11. A composition for forming silica based coating film according to claim 1,
wherein said component (c) is an ammonium salt.

12. A composition for forming silica based coating film according to claim 1, characterized by further comprising nitric acid.

13. A composition for forming silica based coating film according to claim 1,
wherein said component (a) comprises at least one specific bonded atom selected from the group consisting of H, F, B, N, Al, P, Si, Ge, Ti and C atoms, the specific bonded atom being bonded to Si atom forming siloxane bonds of the siloxane resin, and a total number (M) calculated using the relationship represented by the following formula (6) is no more than 0.65:

$$M=(M1+(M2/2)+(M3/3))/Msi \tag{6}$$

where M1 represents a total number of atoms of said at least one specific bonded atom bonded to a single Si atom forming siloxane bonds of the siloxane resin, M2 represents a total number of atoms of said at least one specific bonded atom shared by two Si atoms forming siloxane bonds of the siloxane resin, M3 represents a total number of atoms of said at least one specific bonded atom shared by three Si atoms forming siloxane bonds of the siloxane resin, and Msi represents a total number of Si atoms.

* * * * *